(12) United States Patent
Ko et al.

(10) Patent No.: US 11,723,229 B2
(45) Date of Patent: Aug. 8, 2023

(54) DISPLAY DEVICE HAVING FUSION PATTERN IN SEALING MEMBER INSERTED INTO TRENCH OF DISPLAY PANEL

(71) Applicant: Samsung Display Co., LTD., Yongin-si (KR)

(72) Inventors: Kyung Rok Ko, Suwon-si (KR); Tae Oh Kim, Suwon-si (KR); Byung Hoon Kim, Hwaseong-si (KR); Jung Hyun Kim, Suwon-si (KR); June Hyoung Park, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 183 days.

(21) Appl. No.: 17/077,914

(22) Filed: Oct. 22, 2020

(65) Prior Publication Data

US 2021/0280818 A1    Sep. 9, 2021

(30) Foreign Application Priority Data

Mar. 6, 2020   (KR) .................. 10-2020-0028249

(51) Int. Cl.
*H10K 50/842*     (2023.01)
*H10K 59/12*      (2023.01)
(Continued)

(52) U.S. Cl.
CPC ......... *H10K 50/8426* (2023.02); *H10K 59/12* (2023.02); *H10K 71/00* (2023.02);
(Continued)

(58) Field of Classification Search
CPC .............. H01L 51/5246; H01L 51/525; H01L 27/3244; H10K 59/12; H10K 50/8426
See application file for complete search history.

(56) References Cited

U.S. PATENT DOCUMENTS

| | | | |
|---|---|---|---|
| 8,405,293 B2 * | 3/2013 | Han | H01L 51/5246 313/506 |
| 2007/0173167 A1 | 7/2007 | Choi | |

(Continued)

FOREIGN PATENT DOCUMENTS

| | | |
|---|---|---|
| EP | 2549461 | 1/2013 |
| KR | 100798244 B1 | 1/2008 |

(Continued)

OTHER PUBLICATIONS

Extended European Search Report—Europen Application No. 21152867.4 dated Jul. 6, 2021.

*Primary Examiner* — Michael Jung
(74) *Attorney, Agent, or Firm* — Cantor Colburn LLP

(57) ABSTRACT

A display device includes a display panel including a display area and a non-display area surrounding the display area, an encapsulation substrate disposed on the display panel, a sealing member disposed between the display panel and the encapsulation substrate to bond the display panel and the encapsulation substrate together and a first fusion pattern disposed inside the display panel, the sealing member and the encapsulation substrate, where the display panel comprises a trench formed in the non-display area and recessed into a portion of an upper surface of the display panel, the sealing member is inserted into the trench, and the first fusion pattern is disposed to overlap the trench.

20 Claims, 22 Drawing Sheets

(51) Int. Cl.
*H10K 71/00* (2023.01)
*G09G 3/3233* (2016.01)
*G09G 3/3266* (2016.01)

(52) U.S. Cl.
CPC ......... *G09G 3/3233* (2013.01); *G09G 3/3266* (2013.01); *G09G 2300/0426* (2013.01); *H10K 59/1201* (2023.02)

(56) References Cited

U.S. PATENT DOCUMENTS

| | | |
|---|---|---|
| 2014/0151742 A1 | 6/2014 | Logunov et al. |
| 2015/0001487 A1 | 1/2015 | Kwon et al. |
| 2015/0027168 A1 | 1/2015 | Dabich, II et al. |
| 2015/0069339 A1* | 3/2015 | Han .................. H01L 51/5246 257/40 |
| 2016/0380228 A1 | 12/2016 | Yang et al. |
| 2019/0047251 A1* | 2/2019 | Song .................. B32B 9/04 |

FOREIGN PATENT DOCUMENTS

| | | |
|---|---|---|
| KR | 101135542 B1 | 4/2012 |
| KR | 101362168 B1 | 2/2014 |
| WO | 2015018107 | 2/2015 |
| WO | 2018038967 | 3/2018 |

* cited by examiner

FIG. 14
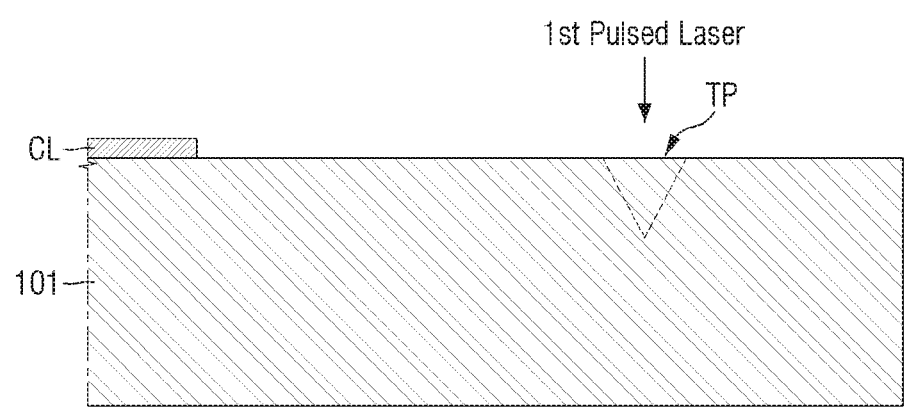
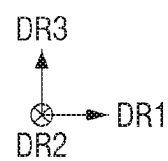

DISPLAY DEVICE HAVING FUSION PATTERN IN SEALING MEMBER INSERTED INTO TRENCH OF DISPLAY PANEL

This application claims priority to Korean Patent Application No. 10-2020-0028249, filed on Mar. 6, 2020, and all the benefits accruing therefrom under 35 U.S.C. 119, the content of which in its entirety is herein incorporated by reference.

BACKGROUND

1. Field

The disclosure relates to a display device and a method of fabricating the display device, and more particularly, to a display device having improved durability against external impact by including a fusion pattern, in which a sealing member and an encapsulation substrate are fused, and a method of fabricating the display device.

2. Description of the Related Art

Recently, various types of display devices such as organic light emitting displays and liquid crystal displays are being widely used with the development of multimedia.

A display device is a device for displaying an image and includes a display panel such as an organic light emitting display panel or a liquid crystal display panel. As a light emitting display panel, the display panel may include light emitting elements such as light emitting diodes "(LED"s). For example, the LEDs may be organic light emitting diodes ("OLED"s) using an organic material as a fluorescent material or may be inorganic LEDs using an inorganic material as the fluorescent material.

SUMMARY

Embodiments of the disclosure provide a display device in which a sealing member bonding a display panel and an encapsulation substrate together has improved adhesion and a method of fabricating the display device.

According to an embodiment of the disclosure, a display device includes a display panel including a display area and a non-display area surrounding the display area, an encapsulation substrate disposed on the display panel, a sealing member disposed between the display panel and the encapsulation substrate to bond the display panel and the encapsulation substrate together and a first fusion pattern disposed inside the display panel, the sealing member and the encapsulation substrate, where a trench is defined in the non-display area of the display panel and recessed from an upper surface of the display panel, the sealing member is inserted into the trench, and the first fusion pattern is disposed to overlap the trench.

In an embodiment, the first fusion pattern may include a material of the sealing member, a material of the display panel and a material of the encapsulation substrate, which are mixed with each other.

In an embodiment, the sealing member may include at least a portion directly contacting the trench and the encapsulation substrate such that a first boundary surface contacting the trench and a second boundary surface contacting the encapsulation substrate are defined, and no physical boundary may exist in a portion of the first fusion pattern corresponding to an extension line of each of the first boundary surface and the second boundary surface.

In an embodiment, the first fusion pattern may include a first portion overlapping the display panel, a second portion contacting the sealing member and a third portion overlapping the encapsulation substrate, and the first fusion pattern may include a third boundary surface between the second portion and the sealing member, a fourth boundary surface between the first portion and the display panel and a fifth boundary surface between the third portion and the encapsulation substrate.

In an embodiment, the third portion of the first fusion pattern may include the material of the sealing member, and the second portion may comprise the material of the encapsulation substrate.

In an embodiment, the first fusion pattern may include a fusion area, in which the sealing member, the display panel and the encapsulation substrate may be partially fused, and a molten area which surrounds the fusion area.

In an embodiment, the fusion area may include a portion which becomes wider as being away farther from the display panel toward the encapsulation substrate.

In an embodiment, the sealing member may include a frit through which light is transmitted.

In an embodiment, a side surface of the sealing member may be inclined, and an inner wall of the trench may be inclined to correspond to the side surface of the sealing member.

In an embodiment, a maximum width of the sealing member may be in a range of about 10 micrometers ($\mu m$) to about 100 $\mu m$, and a maximum width of the first fusion pattern may be in a range of about 8 $\mu m$ to about 12 $\mu m$.

In an embodiment, the display device may further include a second fusion pattern disposed in a periphery of the non-display area between the display panel and the encapsulation substrate, where the second fusion pattern may include the material of the display panel and the material of the encapsulation substrate.

In an embodiment, the second fusion pattern may do not overlap the sealing member and the trench in a thickness direction.

In an embodiment, the first fusion pattern may include the material of the sealing member, and the second fusion pattern may do not include the material of the sealing member.

In an embodiment, the display panel may include a base substrate and a metal wiring layer disposed on at least a portion of the base substrate, and the metal wiring layer may comprise a portion disposed on an upper surface of the base substrate and a bridge portion spaced apart from the trench and disposed inside the base substrate.

According to an embodiment of the disclosure, a display device includes a first substrate including a display area in which a plurality of light emitting elements are disposed and a non-display area surrounding the display area, a second substrate disposed on the first substrate, a sealing member disposed between the first substrate and the second substrate and disposed in the non-display area to surround the display area, and a first fusion pattern disposed between the first substrate and the second substrate to overlap the sealing member, where a trench is defined in the non-display area of the first substrate to surround the display area, and the first fusion pattern overlaps the trench to have a closed curve shape surrounding the display area.

In an embodiment, a maximum width of the trench may be smaller than a maximum width of the sealing member, and at least a portion of the sealing member may be inserted into the trench.

In an embodiment, the maximum width of the sealing member may be in a range of about 10 μm to about 100 μm, and a maximum width of the first fusion pattern may be in a range of about 8 μm to about 12 μm.

In an embodiment, the first fusion pattern may include a material of the sealing member, a material of the first substrate and a material of the second substrate, which are mixed with each other.

In an embodiment, the display device may further include a second fusion pattern disposed in a periphery of the non-display area between the first substrate and the second substrate, where the second fusion pattern may surround the sealing member.

According to an embodiment of the disclosure, a method of fabricating a display device includes preparing a first substrate, which includes a display area and a non-display area surrounding the display area, and forming a trench which is recessed from an upper surface of the first substrate by radiating a first pulsed laser to the non-display area, preparing a second substrate, on which a sealing member is disposed, and attaching the first substrate and the second substrate to each other such that the sealing member is inserted into the trench and forming a first fusion pattern, in which a material of the sealing member, a material of the first substrate and a material of the second substrate are mixed with each other, by radiating a second pulsed laser to the sealing member disposed between the first substrate and the second substrate.

In an embodiment, the first fusion pattern may be formed by mixing the material of the sealing member, the material of the first substrate and the material of the second substrate.

In an embodiment, a focus of the second pulsed laser may be set inside the first substrate at a distance from the trench.

In an embodiment, the trench may be formed to surround the display area, and the sealing member and the first fusion pattern may be provided to surround the display area to have a closed curve shape.

In an embodiment, the method may further include forming a second fusion pattern, in which the material of the first substrate and the material of the second substrate are mixed with each other, by radiating a third pulsed laser along the outside of the sealing member, where a focus of the third pulsed laser may be set inside the first substrate.

In an embodiment, the second fusion pattern may be formed by fusing the first substrate and the second substrate and may be formed to surround the sealing member.

BRIEF DESCRIPTION OF THE DRAWINGS

These and/or other features will become apparent and more readily appreciated from the following description of embodiments, taken in conjunction with the accompanying drawings, in which:

FIGS. 14 through 18 are cross-sectional views illustrating a process of fabricating a display device according to an embodiment;

DETAILED DESCRIPTION

Figure 1:
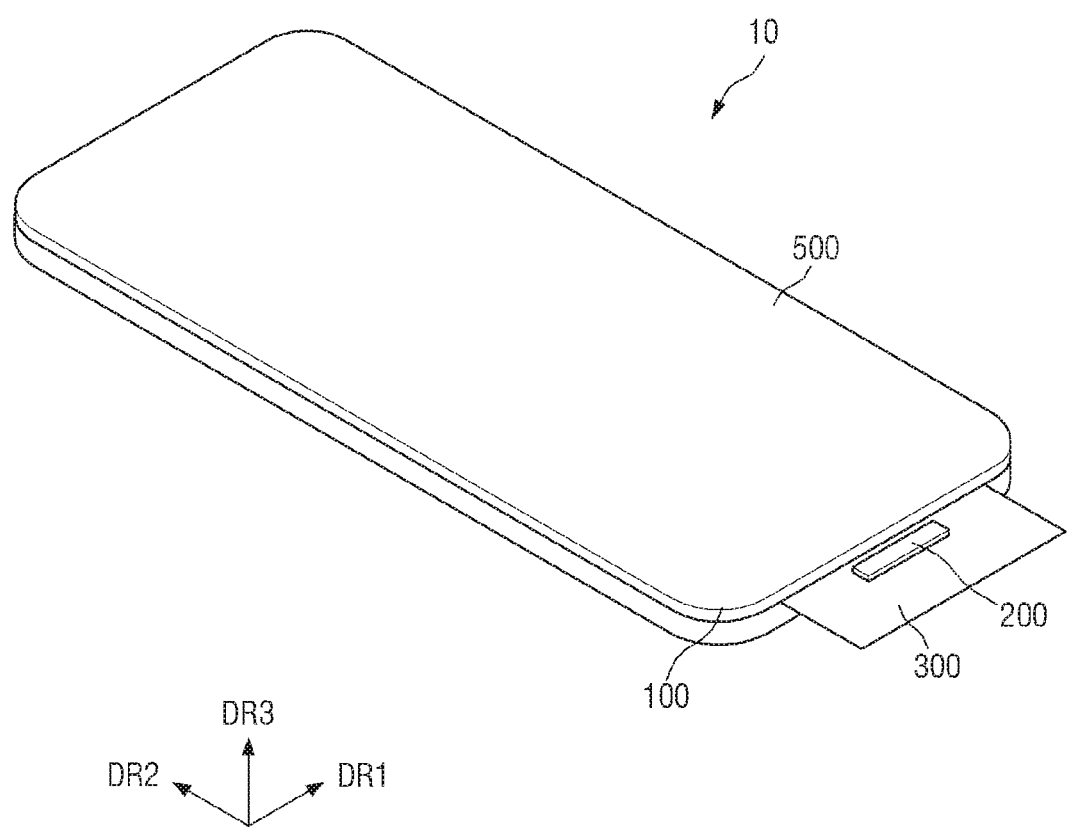
FIG. 1 is a schematic perspective view of a display device according to an embodiment.

The invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/ or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments will be described with reference to the accompanying drawings.

Figure 2:
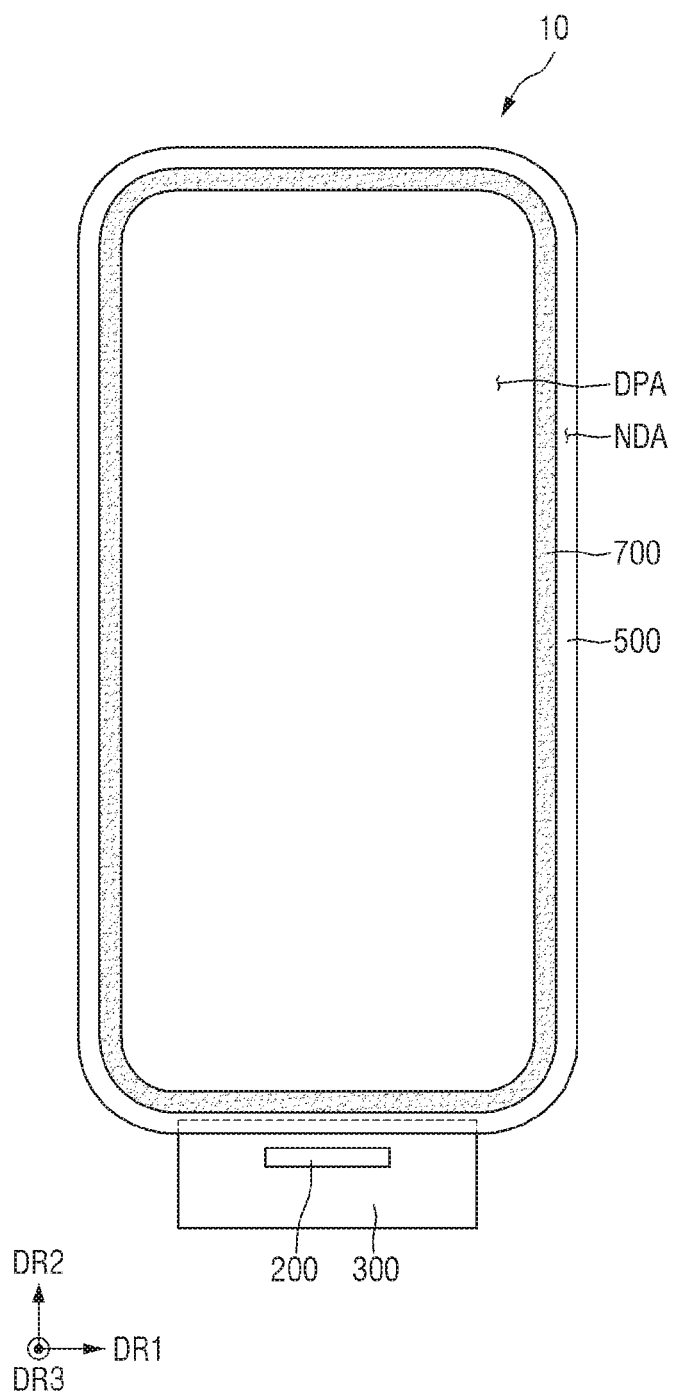
FIG. 2 is a plan view of the display device according to an embodiment.
Figure 3:
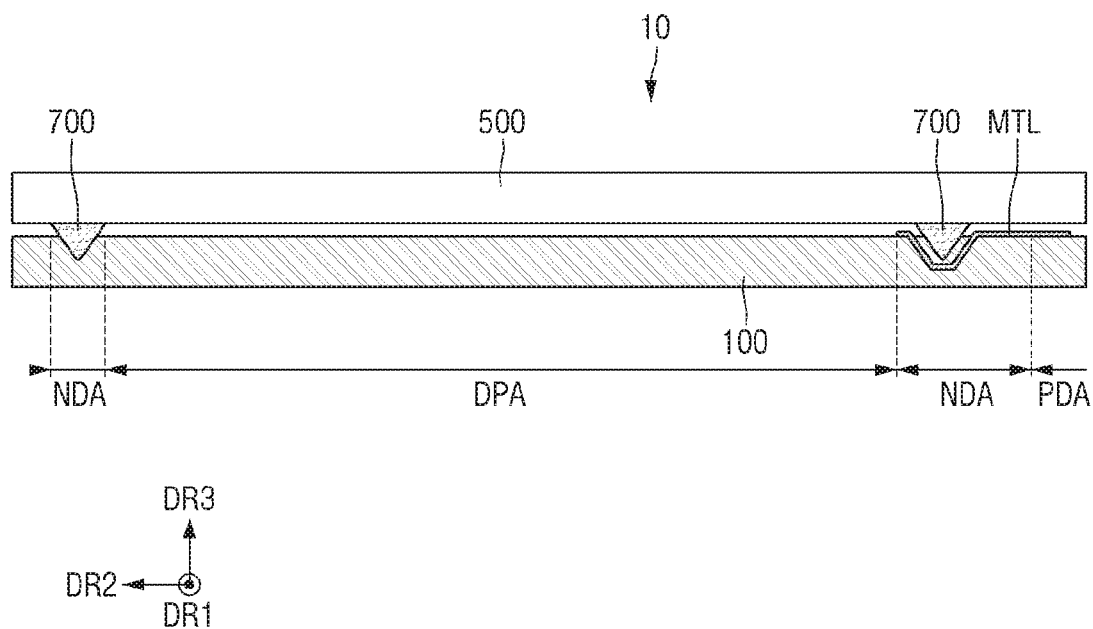
FIG. 3 is a schematic side view of the display device according to an embodiment.

FIG. 1 is a schematic perspective view of a display device 10 according to an embodiment. FIG. 2 is a plan view of the display device 10 according to an embodiment. FIG. 3 is a schematic side view of the display device 10 according to an embodiment. In FIG. 3, for convenience of illustration and description, a display circuit board 300 of the display device 10 is omitted, and only a display panel 100 and an encapsulation substrate 500 are illustrated.

Herein, a first direction DR1 may be a direction parallel to short sides of the display device 10 in a top plan view, for example, may be a horizontal direction of the display device 10. A second direction DR2 may be a direction parallel to long sides of the display device 10 in a top plan view, for example, may be a vertical direction of the display device 10. A third direction DR3 may be a thickness direction of the display device 10. In addition, the first direction DR1 may be a right side when the display device 10 is seen in the third direction DR3, a direction opposite to the first direction DR1 may be a left side, the second direction DR2 may be an upper side when the display device 10 is seen in the third direction DR3, a direction opposite to the second direction DR2 may be a lower side, the third direction DR3 may be an upward direction, and a direction opposite to the third direction DR3 may be a downward direction.

Referring to FIGS. 1 through 3, an embodiment of the display device 10 may be applied to various electronic devices including small and medium-sized electronic devices, such as tablet personal computers ("PC"s), smartphones, car navigation units, cameras, center information displays ("CID"s) provided in cars, wristwatch-type electronic devices, personal digital assistants ("PDA"s), portable multimedia players ("PMP"s) and game machines, or medium and large-sized electronic devices such as televisions, external billboards, monitors, PCs and notebook (or laptop) computers. However, these are merely exemplary, and the display device 10 may also be employed in other electronic devices without departing from the teachings therein.

An embodiment of the display device 10 may be a light emitting display device such as an organic light emitting display device using organic light emitting diodes, a quantum dot light emitting display device including quantum dot light emitting layers, an inorganic light emitting display device including inorganic semiconductors, or a micro light emitting diode display device using micro light emitting diodes. Hereinafter, for convenience of description, embodiments where the display device 10 is an organic light emitting display device will be mainly described, but the disclosure is not limited thereto.

An embodiment of the display device 10 includes a display panel 100 (or a first substrate), a display driver 200, the display circuit board 300, the encapsulation substrate 500 (or a second substrate), and a sealing member 700.

The display panel 100 may have a rectangular planar shape with short sides in the first direction DR1 and long sides in the second direction DR2 intersecting the first direction DR1. Each corner where a short side extending in the first direction DR1 meets a long side extending in the second direction DR2 may be rounded or right-angled. However, the planar shape of the display panel 100 is not limited to the quadrangular shape, and alternatively, the display panel 100 may also have another polygonal shape, a circular shape, or an oval shape.

The display panel 100 may be substantially flat, but the disclosure is not limited thereto. In one embodiment, for example, the display panel 100 may also include a curved portion formed at left and right ends thereof and having a constant or varying curvature. In an embodiment, the display panel 100 may be flexible to be curved, bent, folded, or rolled.

The display panel 100 may include a display area DPA and a non-display area NDA. The display area DPA may be an area where a screen can be displayed, and the non-display area NDA may be an area where no screen is displayed. The display area DPA may also be referred to as an active area, and the non-display area NDA may also be referred to as an inactive area. The display area DPA may generally occupy a center of the display panel 100.

The display area DPA may include a plurality of pixels PX. The pixels PX may be arranged in a matrix form. Each of the pixels PX may be rectangular or square in a plan view. However, the disclosure is not limited thereto, and each of the pixels PX may also have a rhombic planar shape having each side inclined with respect to a direction. The pixels PX may be alternately arranged in a stripe or pentile type. In an embodiment, each of the pixels PX may include one or more light emitting elements EL (see FIG. 5) that emit light of a specific wavelength band to display a specific color.

The non-display area NDA may be disposed around the display area DPA. The non-display area NDA may entirely or partially surround the display area DPA. The display area DPA may be rectangular, and the non-display area NDA may be disposed adjacent to four sides of the display area DPA. The non-display area NDA may correspond to a bezel of the display panel 100. In the non-display area NDA, wirings or circuit drivers included in the display panel 100 may be disposed, or external devices may be mounted.

The display driver 200 outputs signals and voltages for driving the display panel 100. In one embodiment, for example, the display driver 200 may supply data voltages to data wirings. In such an embodiment, the display driver 200 may supply driving voltages to driving voltage wirings and supply scan control signals to a scan driver. The display driver 200 may be formed as an integrated circuit ("IC") and attached onto the display circuit board 300. Alternatively, the display driver 200 may be attached to the display panel 100 using a chip-on-glass ("COG") method, a chip-on-plastic ("COP") method, or an ultrasonic bonding method.

The display circuit board 300 may be disposed in the non-display area NDA at an edge of the display panel 100. In one embodiment, for example, the display circuit board 300 may be disposed in the non-display area NDA at a lower edge of the display panel 100. The display circuit board 300 may be bent toward a lower surface of the display panel 100, and an edge of the display circuit board 300 disposed on the lower surface of the display panel 100 may be attached to the lower surface of the display panel 100. In an embodiment, although not illustrated in the drawings, the display circuit board 300 may be attached and fixed to the lower surface of the display panel 100 through an adhesive member. In such an embodiment, the adhesive member may be a pressure sensitive adhesive. Alternatively, the display circuit board 300 may be omitted, and an edge of the display panel 100 may be bent downward.

The display circuit board 300 may be attached onto display pads of the display panel 100 using an anisotropic conductive film ("ACF"), such that the display circuit board 300 may be electrically connected to the display pads of the display panel 100. The display circuit board 300 may be a flexible printed circuit board, a printed circuit board, or a flexible film such as a chip on film.

The encapsulation substrate 500 (or the second substrate) is disposed on the display panel 100. In one embodiment, for example, the encapsulation substrate 500 may be spaced apart from the display panel 100 in the third direction DR3 to face the display panel 100 and may have substantially a same planar area as the display panel 100 to cover the display area DPA of the display panel 100. However, the disclosure is not limited thereto, and alternatively, the encapsulation substrate 500 may have a smaller planar area than the display panel 100 but cover at least the display area DPA of the display panel 100. The encapsulation substrate 500 may encapsulate the light emitting elements EL and circuit elements disposed in the display panel 100 together with the sealing member 700 to be described later. In an embodiment, a touch member, a polarizing member, etc. may be further disposed on the encapsulation substrate 500.

In an embodiment, the encapsulation substrate 500 may be a transparent plate or a transparent film. In one embodiment, for example, the encapsulation substrate 500 may include a glass material or a quartz material. In an embodiment, the encapsulation substrate 500 may be spaced apart from the light emitting elements EL, and an inert gas such as nitrogen gas may fill a space between them. However, the disclosure is not limited thereto, and alternatively, a filler or the like may fill the space between the encapsulation substrate 500 and the light emitting elements EL.

The sealing member 700 may be disposed between the display panel 100 and the encapsulation substrate 500. In one embodiment, for example, the sealing member 700 may be disposed in the non-display area NDA of the display panel 100 to surround the display area DPA and may encapsulate the light emitting elements EL and the circuit elements of the display panel 100 together with the encapsulation substrate 500. The sealing member 700 may encapsulate a space between the encapsulation substrate 500 and the display panel 100, and moisture or air may be removed from the space during a fabrication process of the display device 10 to create a vacuum in the space. The sealing member 700 may effectively prevent the light emitting elements EL from being damaged by air or moisture together with the encapsulation substrate 500.

The sealing member 700 may bond the display panel 100 and the encapsulation substrate 500 together. The sealing member 700 may be disposed in the non-display area NDA of the display panel 100 to contact and adhere to an upper surface of the display panel 100 and a lower surface of the encapsulation substrate 500. According to an embodiment, the sealing member 700 may bond the display panel 100 and the encapsulation substrate 500 together without contacting a metal wiring layer MTL of the display panel 100.

In an embodiment, the sealing member 700 may include a cured frit. Herein, 'frit' may refer to a structure having glass properties formed by melt-curing glass in powder form optionally added with an additive. The glass in powder form may be placed between the display panel 100 and the encapsulation substrate 500 and then formed into a frit that bonds the display panel 100 and the encapsulation substrate 500 together through a baking and melting process. Hereinafter, for convenience of description, embodiments where the sealing member 700 is a cured frit will be described in detail.

In such an embodiment, the sealing member 700 is formed through the baking and melting process during the fabrication process of the display device 10, such that the display panel 100 and the encapsulation substrate 500 may be coupled to each other through physical bonding with the sealing member 700. According to an embodiment, in the display device 10, at least side surfaces of the sealing member 700 may be inclined, and the display panel 100 may include a trench TP (shown in FIG. 8) recessed into a portion of the upper surface to correspond to the shape of the sealing member 700. Since the display panel 100 includes the trench TP recessed into a portion of the upper surface, the metal wiring layer MTL disposed in the non-display area NDA may surround the trench TP at a distance from the trench TP. In such an embodiment of the display device 10, the sealing member 700 may be inserted into the trench TP, and a contact area between the sealing member 700 and the trench TP may be increased, thereby enabling the display panel 100 and the encapsulation substrate 500 to be more firmly bonded together.

In an embodiment, the display device 10 may include an area in which the sealing member 700 is fused with the encapsulation substrate 500 or the display panel 100 without a physical boundary therebetween. The sealing member 700 may be fused and bonded to at least the encapsulation substrate 500 such that a boundary between the display panel 100 and the encapsulation substrate 500 includes a portion where no physical boundary exists in addition to a portion where a physical boundary exists. Since the display device 10 includes the fused part, the sealing member 700 may be bonded to the display panel 100 and the encapsulation substrate 500 with increased adhesion, and the durability of the display device 10 against external impact may be improved. This will be described in greater detail later.

Figure 4:
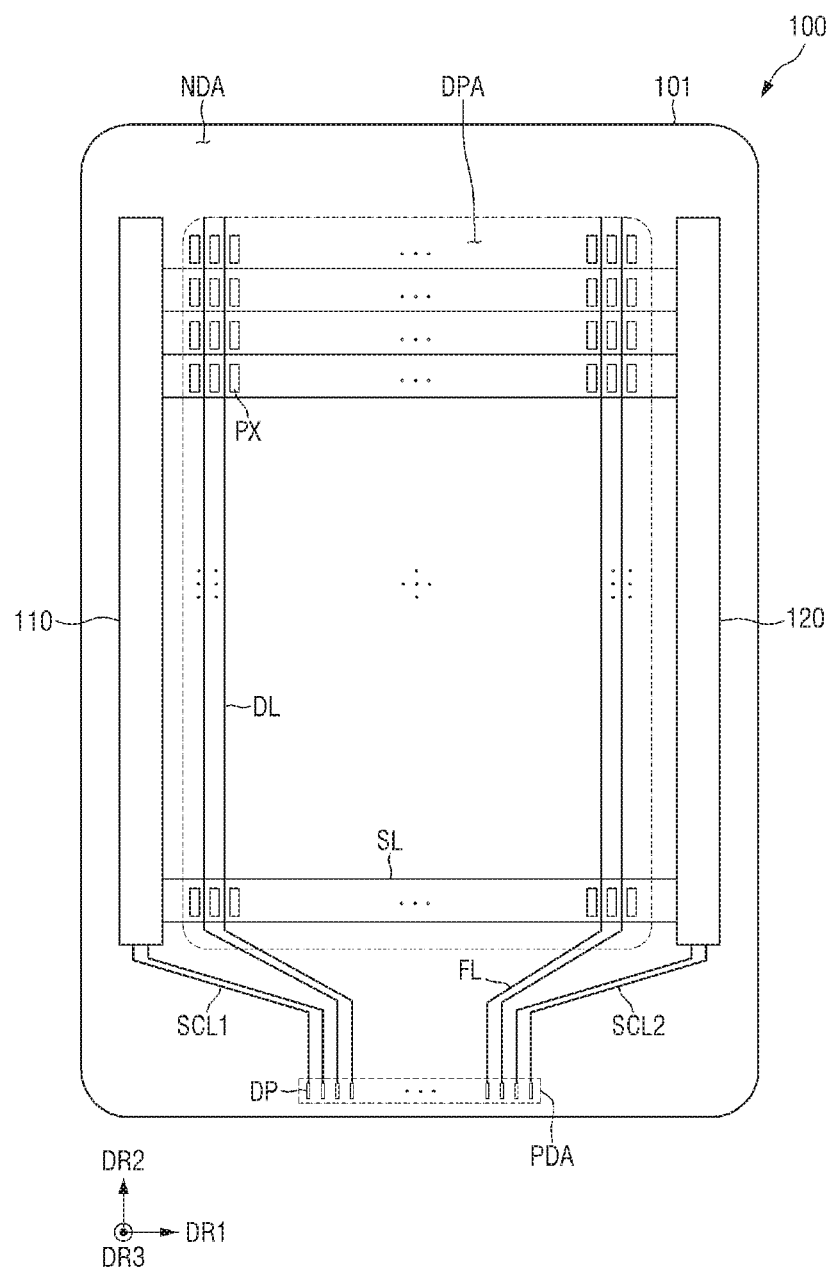
FIG. 4 is a schematic plan view of a display panel according to an embodiment.

FIG. 4 is a schematic plan view of the display panel 100 according to an embodiment.

In FIG. 4, only the pixels PX, scan wirings SL, data wirings DL, first scan control wirings SCL1, second scan control wirings SCL2, a first scan driver 110, a second scan driver 120, the display driver 200, display pads DP, and fan-out wirings FL of the display panel 100 are shown for ease of illustration and description.

Referring to FIG. 4, an embodiment of the display panel 100 may include the display area DPA, in which the pixels PX are disposed to display an image, and the non-display area NDA disposed around the display area DPA. The non-display area NDA may be an area extending from a side of the display area DPA to an edge of the display panel 100.

The scan wirings SL, the data wirings DL, and the pixels PX may be disposed in the display area DPA. The scan wirings SL may extend parallel to each other in the first direction DR1 (X-axis direction), and the data wirings DL may extend parallel to each other in the second direction DR2 (Y-axis direction) intersecting the first direction DR1 (X-axis direction).

Each of the pixels PX may be connected to a corresponding one of the scan wirings SL and a corresponding one of the data wirings DL. Each of the pixels PX may include thin-film transistors including a driving transistor and a switching transistor, an organic light emitting diode, and a capacitor. Each of the pixels PX may receive a data voltage of a data wiring DL in response to a scan signal transmitted from a scan wiring SL and may emit light by supplying a driving current to the organic light emitting diode based on the data voltage applied to a gate electrode of the driving transistor. The structure of the elements disposed in each of the pixels PX will be described in greater detail later with reference to FIG. 5.

The first scan driver 110, the second scan driver 120, the display driver 200, the first scan control wirings SCL1, the second scan control wirings SCL2, and the fan-out wirings FL may be disposed in the non-display area NDA.

The first scan driver 110 is connected to the display driver 200 through the first scan control wirings SCL1. Therefore, the first scan driver 110 may receive a first scan control signal of the display driver 200. The first scan driver 110 generates scan signals based on the first scan control signal and supplies the scan signals to the scan wirings SL.

The second scan driver 120 is connected to the display driver 200 through the second scan control wirings SCL2. Therefore, the second scan driver 120 may receive a second scan control signal of the display driver 200. The second scan driver 120 generates scan signals based on the second scan control signal and supplies the scan signals to the scan wirings SL.

The first scan driver 110 may be connected to the scan wirings SL connected to the pixels PX of the display area DPA. The second scan driver 120 may be connected to the scan wirings SL connected to the pixels PX.

The fan-out wirings FL connect the display pads DP to the data wirings DL, the first scan driver 110, and the second scan driver 120. In an embodiment, the fan-out wirings FL may be disposed between the display pads DP and the data wirings DL, between the display pads DP and the first scan driver 110, and between the display pads DP and the second scan driver 120.

A pad area PDA may include the display pads DP. The display pad area PDA may be disposed at an edge of a base substrate 101 (see FIG. 5) of the display panel 100. In one embodiment, for example, the pad area PDA may be disposed at a lower edge of the base substrate 101 (see FIG. 5).

Figure 5:
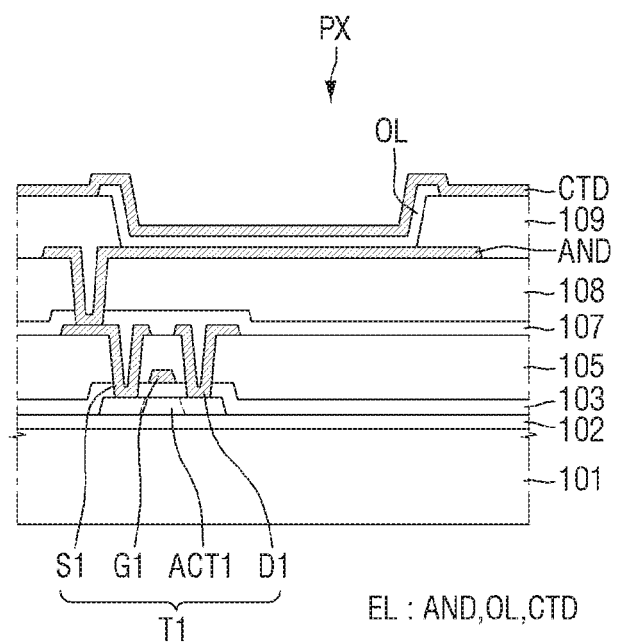
FIG. 5 is a cross-sectional view of one pixel of FIG. 4.

FIG. 5 is a cross-sectional view of one pixel PX of FIG. 4.

Referring to FIG. 5, an embodiment of the display panel 100 may include the base substrate 101 and a thin-film transistor T1 and a light emitting element EL disposed on the base substrate 101. Each pixel PX of the display panel 100 may include a thin-film transistor T1 and the light emitting element EL and may be connected to a scan wiring SL and a data wiring DL as described above. Although a single thin-film transistor T1 in one pixel PX is shown in FIG. 5, the disclosure is not limited thereto.

The base substrate 101 may be a rigid substrate. The base substrate 101 may include or be made of an insulating material such as glass, quartz, or a polymer resin. The polymer material may include at least one material selected from, for example, polyethersulfone ("PES"), polyacrylate ("PA"), polyarylate ("PAR"), polyetherimide ("PEI"), polyethylene naphthalate ("PEN"), polyethylene terephthalate ("PET"), polyphenylene sulfide ("PPS"), polyallylate, polyimide ("PI"), polycarbonate ("PC"), cellulose triacetate ("CAT"), cellulose acetate propionate ("CAP"), or a combination thereof. The base substrate 101 may include a metal material.

A buffer layer 102 may be disposed on the base substrate 101. The buffer layer 102 may be disposed on the base substrate 101 to protect the thin-film transistor T1 and the light emitting element EL from moisture introduced through the base substrate 101 which is vulnerable to moisture penetration. The buffer layer 102 may have a multilayer structure with a plurality of inorganic layers stacked alternately one on another. In one embodiment, for example, the buffer layer 102 may be a multilayer in which inorganic materials selected from silicon oxide (SiOx), silicon nitride (SiNx), and silicon oxynitride (SiON) are alternately stacked. Alternatively, the buffer layer 102 may be omitted.

The thin-film transistor T1 is disposed on the buffer layer 102. The thin-film transistor T1 may include an active layer ACT1, a gate electrode G1, a source electrode S1 and a drain electrode D1. In an embodiment, as shown in FIG. 5, the thin-film transistor T1 may be provided in a top gate manner in which the gate electrode G1 is located above the active layer ACT1. However, the disclosure is not limited thereto. Alternatively, the thin-film transistor T1 may be provided in a bottom gate manner in which the gate electrode G1 is located under the active layer ACT1 or a double gate manner in which the gate electrode G1 is located both above and under the active layer ACT1.

The active layer ACT1 is disposed on the buffer layer 102. The active layer ACT1 may be made of a silicon-based semiconductor material or an oxide-based semiconductor material. Although not illustrated in the drawing, a light blocking layer may be further disposed between the buffer layer 102 and the active layer ACT1 to block external light from entering the active layer ACT1.

A gate insulating layer 103 may be disposed on the active layer ACT1. The gate insulating layer 103 may be an inorganic layer, for example, a multilayer in which one or more inorganic materials selected from silicon oxide (SiOx), silicon nitride (SiNx), and silicon oxynitride (SiON) are alternately stacked one on another.

The gate electrode G1 and a gate line may be disposed on the gate insulating layer 103. Each of the gate electrode GE and the gate line may be a single layer or a multilayer, each layer including at least one selected from molybdenum (Mo), aluminum (Al), chromium (Cr), gold (Au), titanium (Ti), nickel (Ni), neodymium (Ne), copper (Cu), and a combination (e.g., an alloy) thereof.

An interlayer insulating layer 105 may be disposed on the gate electrode G1 and the gate line. The interlayer insulating layer 105 may be an inorganic layer, for example, a multilayer, each layer including at least one inorganic material selected from silicon oxide (SiOx), silicon nitride (SiNx), and silicon oxynitride (SiON).

The source electrode S1, the drain electrode D1, and a data wiring may be disposed on the interlayer insulating layer 105. Each of the source electrode S1 and the drain electrode D1 may be connected to the active layer ACT1 through a contact hole defined through the gate insulating layer 103 and the interlayer insulating layer 105. Each of the source electrode S1, the drain electrode D1, and the data wiring may be a single layer or a multilayer, each layer including at least one selected from molybdenum (Mo), aluminum (Al), chromium (Cr), gold (Au), titanium (Ti), nickel (Ni), neodymium (Ne), copper (Cu), and a combination (e.g., an alloy) thereof.

A protective layer 107 for insulating the thin-film transistor T1 may be disposed on the source electrode S1, the drain electrode D1, and the data wiring. The protective layer 107 may be an inorganic layer, for example, a multilayer, each layer including at least one inorganic material selected from silicon oxide (SiOx), silicon nitride (SiNx), and silicon oxynitride (SiON).

A planarization layer 108 is disposed on the protective layer 107. The planarization layer 108 may planarize a step due to the thin-film transistor T1. The planarization layer 108 may include or be made of an organic layer such as acryl resin, epoxy resin, phenolic resin, polyamide resin, or PI resin.

A pixel defining layer 109 and the light emitting element EL are disposed on the planarization layer 108.

The light emitting element EL may be an organic light emitting device. In an embodiment, the light emitting element EL may include an anode AND, a light emitting layer OL, and a cathode CTD.

The anode AND may be disposed on the planarization layer 108. The anode AND may be connected to the source electrode S1 of the thin-film transistor T1 through a contact hole defined through the protective layer 107 and the planarization layer 108.

The pixel defining layer 109 may be disposed on the planarization layer 108 to cover edges of the anode AND so as to partition the pixels PX. In an embodiment, the pixel defining layer 109 serves as a pixel defining layer that defines the pixels PX. Each pixel PX is an area where the anode AND, the light emitting layer OL and the cathode CTD are sequentially stacked so that holes from the anode AND and electrons from the cathode CTD combine in the light emitting layer OL to emit light.

The light emitting layer OL is disposed on the anode AND and the pixel defining layer 109. The light emitting layer OL may be an organic light emitting layer. In an embodiment, the light emitting layer OL may emit one of red light, green light, and blue light. In an alternative embodiment, the light emitting layer OL may be a white light emitting layer that emits white light. In such an embodiment, the light emitting layer OL may be a stack of a red light emitting layer, a green light emitting layer and a blue light emitting layer and may be a common layer common to all of the pixels PX. In such an embodiment, the display panel 100 may further include separate color filters for displaying red, green and blue.

The light emitting layer OL may include a hole transporting layer, a light emitting layer, and an electron transporting layer. In addition, the light emitting layer OL may be in a tandem structure of two or more stacks with a charge generating layer therebetween.

The cathode CTD is disposed on the light emitting layer OL. The cathode CTD may be formed to cover the light emitting layer OL. The cathode CTD may be a common layer common to all of the pixels PX.

In an embodiment where the light emitting element EL of the display panel 100 is a top emission type which emits light in the upward direction, the anode AND may include or be made of a metal material having high reflectivity, such as a stacked structure (Ti/Al/Ti) of aluminum and titanium, a stacked structure (ITO/Al/ITO) of aluminum and indium tin oxide ("ITO"), an APC alloy, or a stacked structure (ITO/APC/ITO) of an APC alloy and ITO. The APC alloy is an alloy of silver (Ag), palladium (Pd), and copper (Cu). In addition, the cathode CTD may include or be made of a transparent conductive material ("TCO") capable of transmitting light, such as ITO or indium zinc oxide ("IZO"), or a semi-transmissive conductive material such as magnesium (Mg), silver (Ag) or an alloy of Mg and Ag. In an embodiment where the cathode CTD is made of a semi-transmissive conductive material, light output efficiency may be increased by a microcavity effect. In an embodiment, where the light emitting element EL is a bottom emission type which emits light in the downward direction, the anode AND may include or be made of a TCO such as ITO or IZO or a semi-transmissive conductive material such as magnesium (Mg), silver (Ag) or an alloy of Mg and Ag. The cathode CTD may include or be made of a metal material having high reflectivity, such as a stacked structure (Ti/Al/Ti) of aluminum and titanium, a stacked structure (ITO/Al/ITO) of aluminum and ITO, an APC alloy, or a stacked structure (ITO/APC/ITO) of an APC alloy and ITO. In an embodiment where the anode AND is made of a semi-transmissive conductive material, the light output efficiency may be increased by a microcavity effect.

Figure 6:
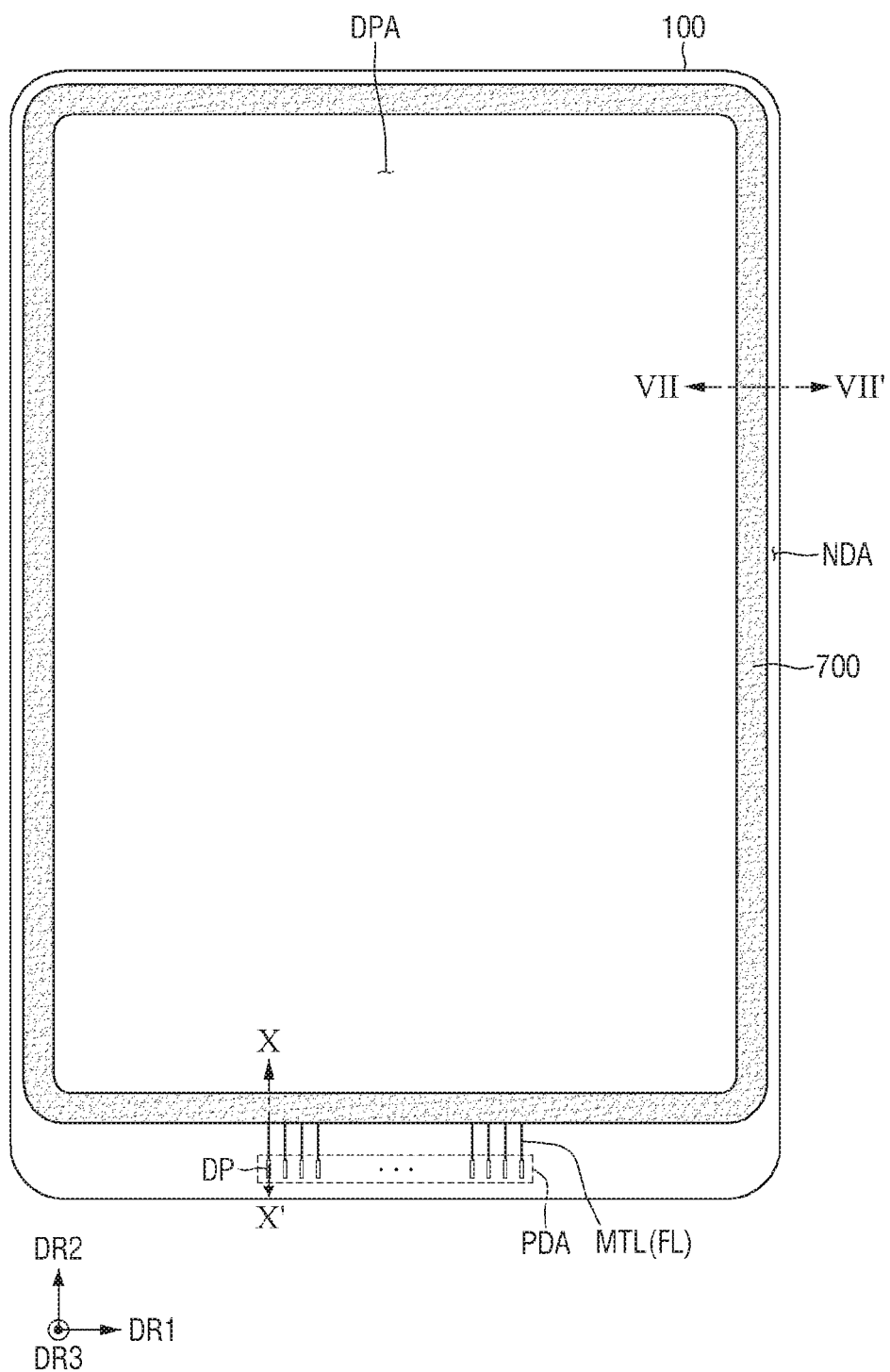
FIG. 6 is a schematic plan view illustrating a sealing member disposed on the display panel according to an embodiment.
Figure 7:
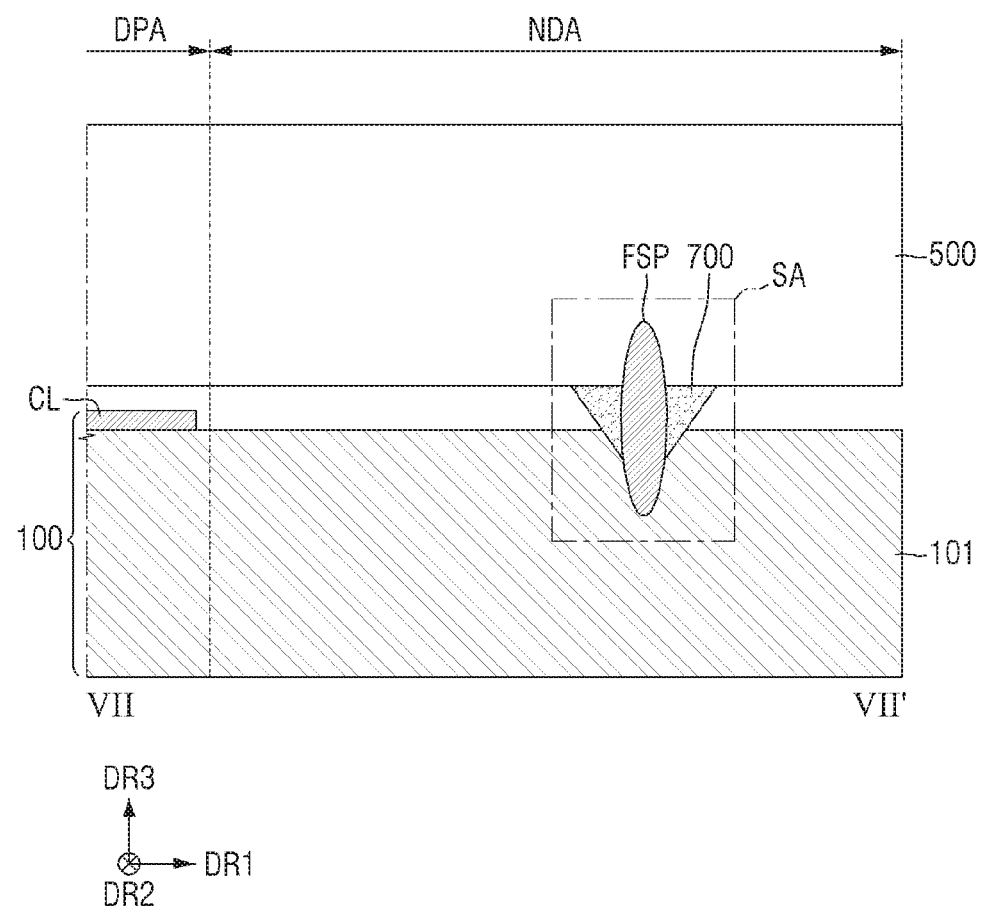
FIG. 7 is a cross-sectional view taken along line VII-VII' of FIG. 6.
Figure 8:
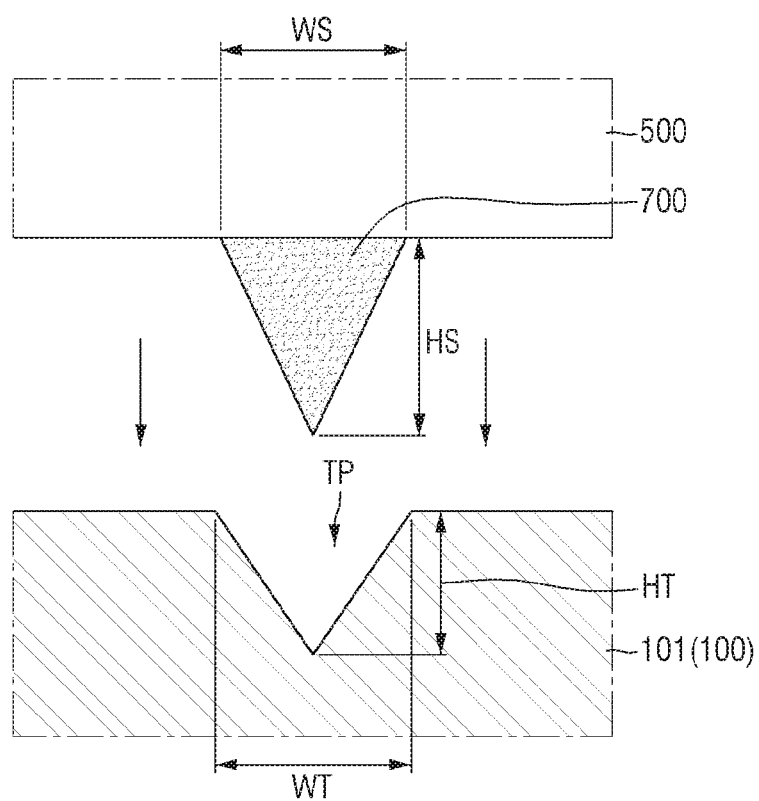
FIG. 8 is a schematic cross-sectional view of a trench formed in the display panel and the sealing member disposed on a surface of an encapsulation substrate according to an embodiment.

FIG. 6 is a schematic plan view illustrating the sealing member 700 disposed on the display panel 100 according to an embodiment. FIG. 7 is a cross-sectional view taken along line VII-VII' of FIG. 6. FIG. 8 is a schematic cross-sectional view of the trench TP formed in the display panel 100 and the sealing member 700 disposed on a surface of the encapsulation substrate 500 according to an embodiment.

FIG. 7 illustrates a cross-section of a portion of the non-display area NDA of the display panel 100 located at a side in the first direction DR1 of the display area DPA. FIG. 8 is a schematic view illustrating the trench TP formed in the display panel 100 and the sealing member 700 inserted into the trench TP.

Referring to FIGS. 6 through 8, a cell CL including a plurality of circuit elements, a plurality of insulating layers and the light emitting elements EL described above is disposed in the display area DPA of the display device 10, and the sealing member 700 for bonding the display panel 100 and the encapsulation substrate 500 together is disposed in the non-display area NDA. The cell CL may be an area in which the pixels PX of the display device 10, each including the light emitting element EL described above with reference to FIG. 5, is disposed. For convenience of description, any repetitive detailed description of the same or like elements as those described above will hereinafter be omitted.

The sealing member 700 of the display device 10 may be disposed in the non-display area NDA to surround the display area DPA of the display panel 100 while forming a closed curve in a plan view. In an embodiment, the sealing member 700 may surround the light emitting elements EL disposed in the display area DPA and may encapsulate the space between the encapsulation substrate 500 and the display panel 100. Moisture or air may be removed from the space during the fabrication process of the display device 10 to create a vacuum in the space, and the sealing member 700 may prevent the light emitting elements EL from being damaged by air or moisture together with the encapsulation substrate 500.

The sealing member 700 may be disposed between the base substrate 101 and the encapsulation substrate 500 in the non-display area NDA of the display panel 100. According to an embodiment, at least a portion of the sealing member 700 may directly contact an upper surface of the base substrate 101 and the lower surface of the encapsulation substrate 500, and the display panel 100 and the encapsulation substrate 500 of the display device 10 may be bonded together through the sealing member 700. The sealing member 700 may include a frit, and the sealing member 700 may bond the display panel 100 and the encapsulation substrate 500 together through a physical bonding. A physical boundary may exist between the sealing member 700 and each of the base substrate 101 of the display panel 100 and the encapsulation substrate 500.

According to an embodiment, the display panel 100 of the display device 10 may include the trench TP recessed into a portion of the upper surface of the display panel 100. The trench TP may be defined or formed in the non-display area NDA of the display panel 100 and may overlap the sealing member 700 when viewed from a plan view in a thickness direction of the display panel 100 or in the third direction DR 3. In an embodiment of the display device 10, the display panel 100 may include the trench TP, and the sealing member 700 may be inserted into the trench TP. In such an embodiment where the sealing member 700 is inserted into the trench TP, a contact area between the display panel 100 and the sealing member 700 may be increased as compared with when the upper surface of the display panel 100 is flat. In an embodiment of the display device 10, the sealing member 700 and the display panel 100 may have a large contact area, and the display panel 100 and the encapsulation substrate 500 may be firmly bonded together.

The sealing member 700 may become narrower as moving away farther from the encapsulation substrate 500 toward the display panel 100. According to an embodiment, at least the side surfaces of the sealing member 700 may be inclined, and a portion of the sealing member 700 contacting the encapsulation substrate 500 may be wider than a portion contacting the display panel 100. The sealing member 700 may have a maximum width WS in the portion contacting the encapsulation substrate 500, and the portion contacting the display panel 100 may have a smaller width than the portion contacting the encapsulation substrate 500.

The trench TP of the display panel 100 may be recessed into a portion of the upper surface of the display panel 100 to correspond to the shape of the sealing member 700. According to an embodiment, the trench TP may be recessed into a portion of the upper surface of the base substrate 101 of the display panel 100. However, the disclosure is not limited thereto, and the trench TP may be formed in a portion of the non-display area NDA of the display panel 100 in which at least one insulating layer is disposed. The trench TP may have a shape corresponding to the shape of the sealing member 700 such that the sealing member 700 may be effectively inserted into the trench TP. According to an embodiment, the trench TP of the display panel 100 may become narrower as moving farther from the upper surface of the display panel 100 or the base substrate 101. In one embodiment, for example, inner walls of the trench TP may be inclined to correspond to the lateral shape of the sealing member 700. However, the disclosure is not limited thereto, and the cross-sectional shape of the trench TP of the sealing member 700 may be variously modified.

In an embodiment, a maximum width WS of the sealing member 700 may be greater than a maximum width WT of the trench TP. A portion of the sealing member 700 may be inserted into the trench TP, and the remaining portion may be located between the display panel 100 and the encapsulation substrate 500 to cover the display area DPA in which the light emitting elements EL are disposed. A thickness HS of the sealing member 700 may be determined to correspond to a gap between the display panel 100 and the encapsulation substrate 500 and a depth HT of the trench TP. In an embodiment, the gap between the display panel 100 and the encapsulation substrate 500 may be in a range of about 3 micrometers (μm) to about 5 μm, and the thickness HS of the sealing member 700 may be about 5 μm or more or in a range of about 5 μm to about 10 μm. However, the disclosure is not limited thereto, and the thickness HS of the sealing member 700 may be variously modified to correspond to the gap between the display panel 100 and the encapsulation substrate 500 and the depth HT of the trench TP.

The encapsulation substrate 500 and the display panel 100, on which the sealing member 700 is provided or formed during the fabrication process of the display device 10, may be aligned and attached to each other so that the gap between the encapsulation substrate 500 and the display panel 100 may be the range described above. In an embodiment, the trench TP may have a predetermined depth HT or more in consideration of an error range of a thickness of the cell CL disposed in the display area DPA. In an embodiment, the depth HT of the trench TP of the display panel 100 may be in a range of about 10 μm to about 15 μm. In the process of attaching the display panel 100 and the encapsulation substrate 500 to each other, a portion of the sealing member 700 may be inserted into the trench TP, and the side surfaces of the sealing member 700 may only partially contact the inner walls of the trench TP. In a subsequent process of attaching and fusing the display panel 100 and the encapsulation substrate 500 with the sealing member 700, the side surfaces of the sealing member 700 may contact the inner walls of the trench TP.

In an embodiment, the display device 10 may further include a fusion pattern, FSP, in which the sealing member 700 is fused with the encapsulation substrate 500 or the display panel 100, so that no physical boundary exists therebetween. In an embodiment, the fusion pattern FSP may be disposed formed at least at a boundary defined or formed by the sealing member 700 and the encapsulation substrate 500. In one embodiment, for example, the fusion pattern FSP may be disposed over a portion of the encapsulation substrate 500, a portion of the sealing member 700, and a portion of the display panel 100. A height HF (shown in FIG. 9) of the fusion pattern FSP may be greater than the thickness HS of the sealing member 700, and at least a portion of the fusion pattern FSP may be disposed in the encapsulation substrate 500 and the base substrate 101 of the display panel 100. Although the fusion pattern FSP extends from the base substrate 101 of the display panel 100 to the encapsulation substrate 500 via the sealing member 7M) in the drawings, the disclosure is not limited thereto. The fusion pattern FSP may be disposed at least over the boundary between the sealing member 700 and the encapsulation substrate 500 to complement the interfacial adhesion between the sealing member 700 and the encapsulation substrate 500.

According to an embodiment, the fusion pattern FSP may be an area where the sealing member 700 is fused with the display panel 100 and the encapsulation substrate 500 so that no physical boundary exists therebetween and may be an area formed as the material of the sealing member 700 and the material of the display panel 100 or the encapsulation substrate 500 are mixed with each other. In one embodiment, for example, when the sealing member 700 is disposed to directly contact the encapsulation substrate 500 and the base substrate 101 of the display panel 100, the fusion pattern FSP may be formed as the materials of the encapsulation substrate 500, the base substrate 101 and the sealing member 700 are mixed with each other.

In an embodiment, as described above, the base substrate 101 and the encapsulation substrate 500 may include a material such as glass, and the sealing member 700 may include a frit, that is, a material similar to the material of the base substrate 101 and the encapsulation substrate 500. The fusion pattern FSP may be defined by or formed as a portion of the material of the sealing member 700 flows into the encapsulation substrate 500 and the base substrate 101 and a portion of the material of the encapsulation substrate 500 and the base substrate 101 flows into the sealing member 700 and then the materials the sealing member 700, the encapsulation substrate 500 and the base substrate 101 are mixed with each other. Accordingly, in a portion where the fusion pattern FSP is formed, no physical boundary may exist between an upper surface of the sealing member 700 and the lower surface of the encapsulation substrate 500. In such an embodiment, in the portion where the fusion pattern FSP is formed, no physical boundary may exist between a lower surface of the sealing member 700 and the inner walls of the trench TP formed in the display panel 100 or the base substrate 101. Since the fusion pattern FSP is formed by the fusing of the sealing member 700 with the encapsulation substrate 500 and the display panel 100 and the mixing of the materials that form them, the adhesion between the display panel 100 and the encapsulation substrate 500 may be improved. Although only one fusion pattern FSP is illustrated in a widthwise direction of the sealing member 700 in the drawings, the disclosure is not limited thereto. A plurality of fusion patterns FSP may be formed along the widthwise direction of the sealing member 700 and may be spaced apart from each other. The fusion pattern FSP will be described in greater detail with further reference to other drawings.

Figure 9:
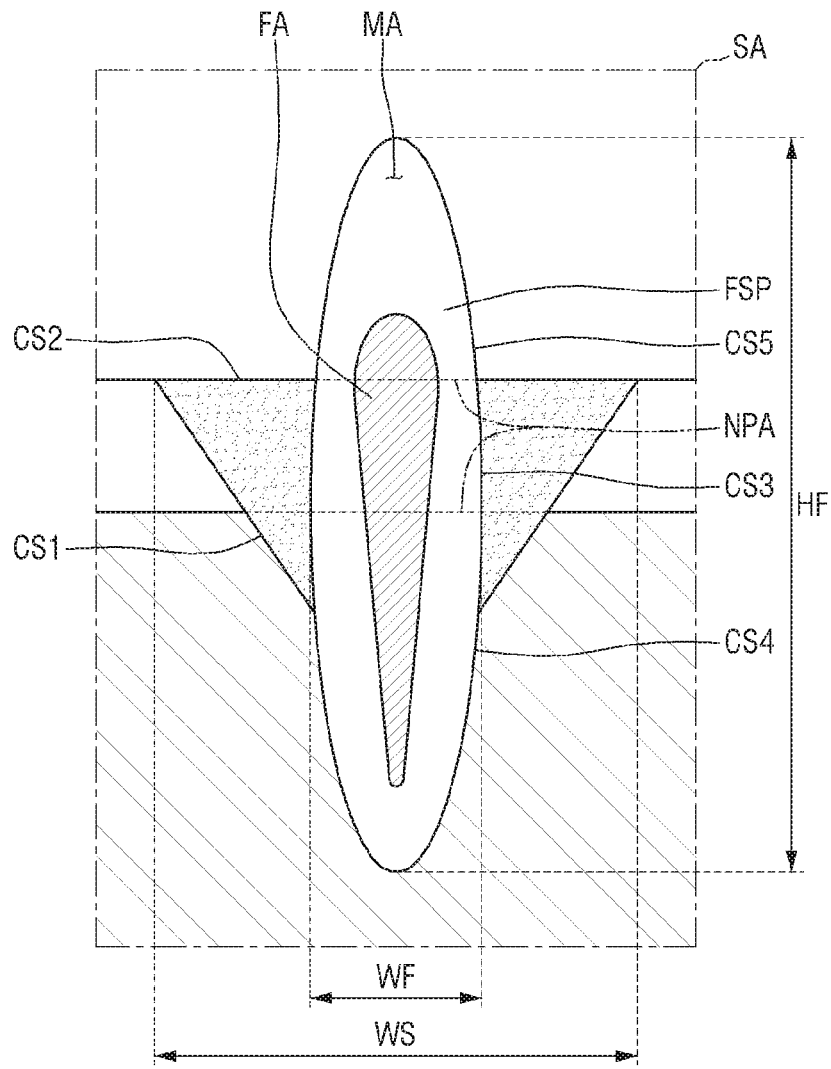
FIG. 9 is an enlarged schematic view of portion SA of FIG. 7.

FIG. 9 is an enlarged schematic view of portion SA of FIG. 7. FIG. 9 illustrates the shape of the fusion pattern FSP disposed over the base substrate 101 of the display panel 100, the sealing member 700, and the encapsulation substrate 500.

Referring to FIG. 9, in an embodiment, the sealing member 700 may include a portion that physically contacts the display panel 100 or the encapsulation substrate 500 at a boundary with the display panel 100 or the encapsulation substrate 500. In such an embodiment, the sealing member 700 may directly contact the display panel 100 and the encapsulation substrate 500, and physical boundaries may exist in areas where the sealing member 700 contact the display panel 100 and the encapsulation substrate 500. In one embodiment, for example, a physical boundary may exist between the lower surface of the encapsulation substrate 500 and the upper surface of the sealing member 700 and between the inner walls of the trench TP of the display panel 100 and the side surfaces of the sealing member 700.

The fusion pattern FSP may be disposed or formed over at least portion of the boundaries formed by the sealing member 700, the display panel 100 and the encapsulation substrate 500. The fusion pattern FSP may be an area where the sealing member 700 is fused with each of the display panel 100 and the encapsulation substrate 500 without a physical boundary between them. According to an embodiment, the fusion pattern FSP may include a fusion area FA in which the material of the sealing member 700 and the material of the encapsulation substrate 500 are fused and a molten area MA which surrounds the fusion area FA and in which the materials of the sealing member 700, the display panel 100 and the encapsulation substrate 500 are melted and mixed with each other. The fusion area FA may be a portion where the materials of the sealing member 700, the encapsulation substrate 500 and the display panel 100 are fused by plasma generated by a pulsed laser radiated to form the fusion pattern FSP during the fabrication process of the display device 10. The molten area MA may be an area formed as an area around the fusion area FA is melted by heat and then solidified during fusion by the plasma. In the molten area MA, the materials of the sealing member 700, the encapsulation substrate 500 and the display panel 100 may also be mixed with each other. According to an embodiment, the fusion pattern FSP including the fusion area FA and the molten area MA may more firmly bond the display panel 100 and the encapsulation substrate 500 together.

In an embodiment, the sealing member 700 may include a first boundary surface CS1 that forms physical boundaries with the inner walls of the trench TP of the display panel 100 and a second boundary surface CS2 that forms a physical boundary with the lower surface of the encapsulation substrate 500. According to an embodiment, the fusion pattern FSP may be disposed or formed across the sealing member 700 between the display panel 100 and the encapsulation substrate 500, and a third boundary surface CS3 may be formed between the sealing member 700 and the fusion pattern FSP, a fourth boundary surface CS4 may be formed between the fusion pattern FSP and the display panel 100 (or the base substrate 101), and a fifth boundary surface CS5 may be formed between the encapsulation substrate 500 and the fusion pattern FSP. Each of the first boundary surface CS1 and the second boundary surface CS2 is a surface where the sealing member 700 contacts the display panel 100 or the encapsulation substrate 500 and may be a physically defined boundary. At the first boundary surface CS1 and the second boundary surface CS2, the material of the sealing member 700 does not move to the display panel 100 or the encapsulation substrate 500 or is not mixed with the material of the display panel 100 or the encapsulation substrate 500. The sealing member 700 may be kept bonded to the display panel 100 and the encapsulation substrate 500 at the first boundary surface CS1 and the second boundary surface CS2, respectively.

In an embodiment, as described above, the fusion pattern FSP may include the fusion area FA and the molten area MA. In a portion where the upper surface of the base substrate 101 of the display panel 100 extends, a portion NPA (see FIG. 9) where no physical boundary exists may be formed in a portion where the fusion pattern FSP is formed. In such an embodiment, the area NPA where no physical boundary exists may also be formed in a portion of the fusion pattern FSP corresponding to (on a same plane as or extending from) each of the first boundary surface CS1 and the second boundary surface CS2. That is, a fused area without a physical boundary may be formed at a portion of a boundary surface between the sealing member 700 and the display panel or the encapsulation substrate 500.

The third through fifth boundary surfaces CS3 through CS5 may be boundary surfaces formed with the fusion pattern FSP inside the sealing member 700, the base substrate 101 of the display panel 100, and the encapsulation substrate 500, respectively. According to an embodiment, unlike the first boundary surface CS1 and the second boundary surface CS2, the third through fifth boundary surfaces CS3 through CS5 of the fusion pattern FSP may not be physical boundaries but may be boundaries formed between areas having different components from each other at different positions. The fusion pattern FSP may be formed by the mixing of the materials of the base substrate 101 of the display panel 100, the encapsulation substrate 500 and the sealing member 700. Since the materials of the base substrate 101, the sealing member 700 and the encapsulation substrate 500 are all included and mixed in the fusion pattern FSP, the materials of the base substrate 101, the sealing member 700 and the encapsulation substrate 500 may all be disposed in the fusion pattern FSP. In one embodiment, for example, a frit component which is a first component forming the sealing member 700 and a glass component which is a second component forming the base substrate 101 and the encapsulation substrate 500 may be disposed in a mixed state in the fusion pattern FSP. In an embodiment, only the frit component is disposed in the sealing member 700 and only the glass component is disposed in the encapsulation substrate 500, boundaries, albeit not physical boundaries, may be defined or formed at the third through fifth boundary surfaces CS3 through CS5 due to component differences.

In an embodiment, the fusion pattern FSP may include the second component of the encapsulation substrate 500 or the base substrate 101 in a greater amount than that of the sealing member 700 in a portion defined by the third boundary surface CS3. In such an embodiment, the fusion pattern FSP may include the first component of the sealing member 700 in a greater amount than that of the base substrate 101 in a portion defined by the fourth boundary surface CS4, and include the first component of the sealing member 700 in a greater amount than that of the encapsulation substrate 500 in a portion defined by the fifth boundary surface CS5. However, since the base substrate 101, the sealing member 700, the encapsulation substrate 500 and the fusion pattern FSP include common components based on the third through fifth boundary surfaces CS3 through CS5, there may be no physical boundary therebetween.

The fusion pattern FSP may be formed as the sealing member 700, the display panel 100 and the encapsulation substrate 500 are partially fused by a pulsed laser radiated from an upper surface of the encapsulation substrate 500 during the fabrication process of the display device 10. As will be described later, the pulsed laser may be set in a way such that a focus thereof is located inside the display panel 100, and mixing of materials may occur at the boundary between each of the display panel 100 and the encapsulation substrate 500 and the sealing member 700.

The fusion pattern FSP may extend in the thickness direction of the display device 10. The fusion pattern FSP may have a maximum width WF in a portion overlapping the sealing member 700 and may become narrower toward the display panel 100 and the encapsulation substrate 500. In one embodiment, for example, in the fusion pattern FSP, the portion overlapping the sealing member 700 may be wider than both end portions in a direction in which the fusion pattern FSP extends. In an embodiment, the fusion area FA of the fusion pattern FSP may include a first portion overlapping the display panel 100, a second portion overlapping the sealing member 700, and a third portion overlapping the encapsulation substrate 500. In such an embodiment, a maximum width of the third portion may be greater than maximum widths of the first portion and the second part. In such an embodiment, the maximum width of the second portion may be greater than the maximum width of the first part.

The pulsed laser used to form the fusion pattern FSP may be set in a way such that a focus thereof is located inside the display panel 100, and the maximum width of the fusion area FA of the fusion pattern FSP may increase from the first portion toward the third part. Since the first portion of the fusion area FA is located closer to the laser focus than the second part, it may have inclined side surfaces and may be connected to the second part. The second portion may have a maximum width in the area NPA where no physical boundary exists in the portion where the upper surface of the display panel 100 extends. The maximum width of the third portion may be the maximum width of the fusion area FA. Since the third portion is located farther from the laser focus than the second part, the maximum width of the third portion may be greater than the maximum width of the second part.

The maximum width WF and the height HF of the fusion pattern FSP may vary based on the thickness HS of the sealing member 700. According to an embodiment, the height HF of the fusion pattern FSP may be greater than the thickness HS of the sealing member 700.

In an exemplary embodiment, the thickness HS of the sealing member 700 may be in a range of about 5 µm to about 10 µm or may be about 5 µm. The height HF of the fusion pattern FSP may be in a range of about 10 µm to about 20 µm or in a range of about 12 µm to about 18 µm. The maximum width WF of the fusion pattern FSP may be in a range of about 8 µm to about 12 µm or in a range of about 9 µm to about 11 µm, preferably, may be about 10 µm. However, the maximum width WF of the fusion pattern FSP may vary based on the gap between the display panel 100 and the encapsulation substrate 500 or the material or thickness of the sealing member 700. The above dimensions of the fusion pattern FSP are merely exemplary, and the embodiments are not limited thereto.

Since the display device 10 includes not only the sealing member 700 for bonding the display panel 100 and the encapsulation substrate 500 but also the fusion pattern FSP disposed therein, the adhesion between the display panel 100 and the encapsulation substrate 500 may be substantially improved. According to an embodiment, since the display device 10 includes the fusion pattern FSP, the sealing member 700 may have a small width, and the non-display area NDA may be minimized. The width WS of the sealing member 700 may be minimized as long as it is greater than the width WF of the fusion pattern FSP. In an embodiment, the width WS of the sealing member 700 may be in a range of about 10 μm to about 100 μm, but the disclosure is not limited thereto.

Although a portion of the non-display area NDA of the display panel 100, in which the metal wiring layer MTL is not disposed, is illustrated in FIG. 7, the disclosure is not limited thereto. At least one metal wiring layer MTL may be disposed in the non-display area NDA of the display panel 100, and at least a portion of the sealing member 700 may be disposed to overlap the metal wiring layer MTL in the thickness direction.

Figure 10:
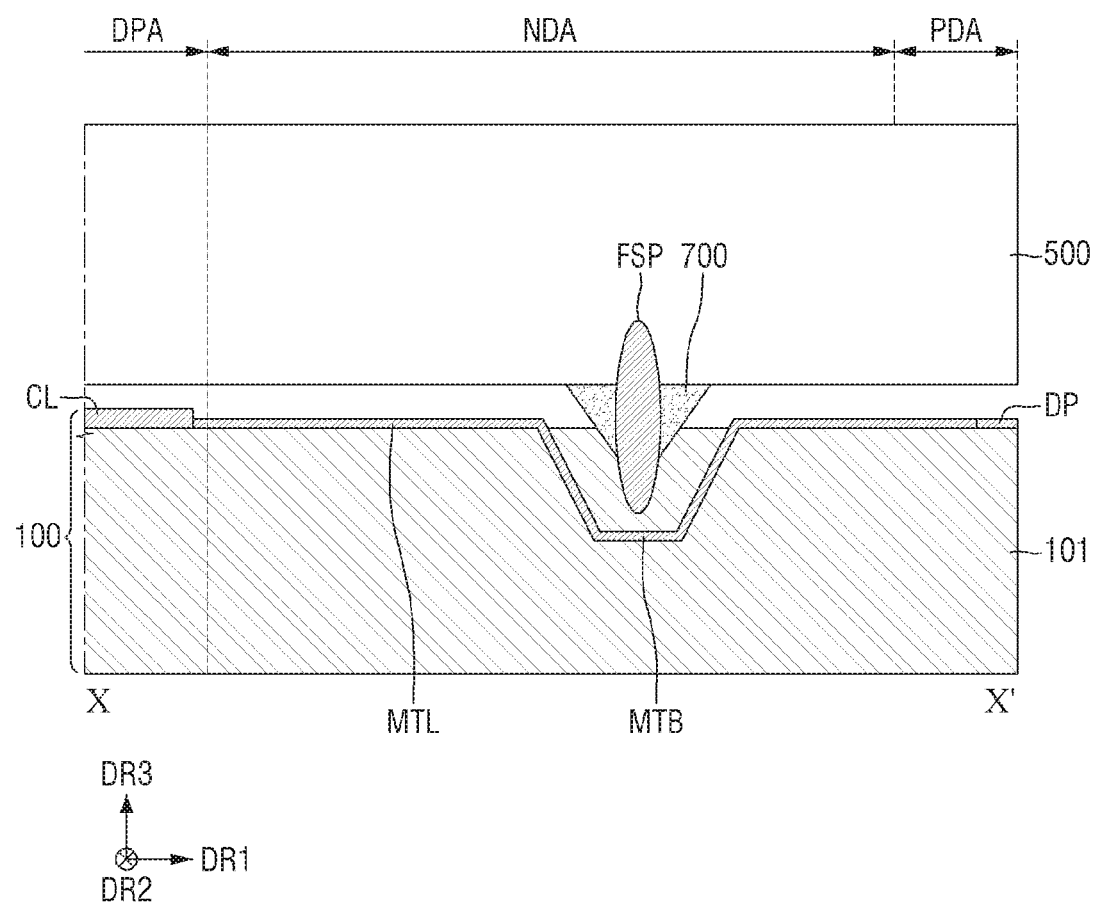
FIG. 10 is a cross-sectional view taken along line X-X' of FIG. 6.

FIG. 10 is a cross-sectional view taken along line X-X' of FIG. 6. FIG. 10 illustrates a cross-section of the non-display area NDA of the display panel 100 which includes a portion where the metal wiring layer MTL is disposed. FIG. 10 illustrates a cross-section of a portion of the non-display area NDA of the display panel 100 which is adjacent to the pad area PDA on a side of the display area DPA in the second direction DR2.

Referring to FIG. 10, the metal wiring layer MTL may be disposed in at least a portion of the non-display area NDA of the display panel 100, for example, in the non-display area NDA adjacent to the pad area PDA. The metal wiring layer MTL may be connected to the cell CL disposed in the display area DPA and may be disposed over the display area DPA, the non-display area NDA and the pad area PDA. In an embodiment, as described above, the first scan driver 110, the second scan driver 120, the fan-out wirings FL, etc. may be disposed in the non-display area NDA of the display panel 100. The metal wiring layer MTL of FIG. 10 may be a fan-out wiring FL disposed in the non-display area NDA, but the disclosure is not limited thereto. The metal wiring layer MTL may be the fan-out wiring FL, the first scan driver 110 or the second scan driver 120, and the sealing member 700 may be disposed to partially overlap the circuit elements or wirings disposed in the first scan driver 110 or the second scan driver 120 disposed in the non-display area NDA.

The display panel 100 may include the trench TP recessed into a portion of the upper surface, and the trench TP may surround the display area DPA and have a closed curve shape as will be described later. The trench TP may also be disposed in the non-display area NDA in which the metal wiring layer MTL is disposed, and the trench TP and the sealing member 700 inserted into the trench TP may overlap the metal wiring layer MTL in the thickness direction. Since an electrical signal flowing through the first scan driver 110, the second scan driver 120 and the fan-out wiring FL is transmitted to the metal wiring layer MTL, it may be desired to prevent the metal wiring layer MTL from being interrupted by the fusion pattern FSP disposed in the trench TP or the sealing member 700. In an embodiment of the display panel 100 of the display device 10, the metal wiring layer MTL may include a portion disposed on the upper surface of the base substrate 101 and a bridge portion MTB inserted into the base substrate 101. The bridge portion MTB may be inserted into the base substrate 101 in a portion where the trench TP is disposed and may be spaced apart from the trench TP, and the portion of the metal wiring layer MTL which are disposed on the upper surface of the base substrate 101 may be connected through the bridge portion MTB. The bridge portion MTB may overlap the trench TP and the fusion pattern FSP in the thickness direction but may be spaced apart from them without directly contacting them. The metal wiring layer MTL including the bridge portion MTB can be prevented from being interrupted by the fusion pattern FSP.

The sealing member 700 may be disposed along the non-display area NDA of the display panel 100 to form a closed curve to surround the display area DPA. According to an embodiment, the trench TP and the fusion pattern FSP formed in the display panel 100 may be disposed along the sealing member 700 to form a closed curve. The trench TP and the fusion pattern FSP disposed in the non-display area NDA may surround the display area DPA and may be disposed in a closed curve shape.

Figure 11:
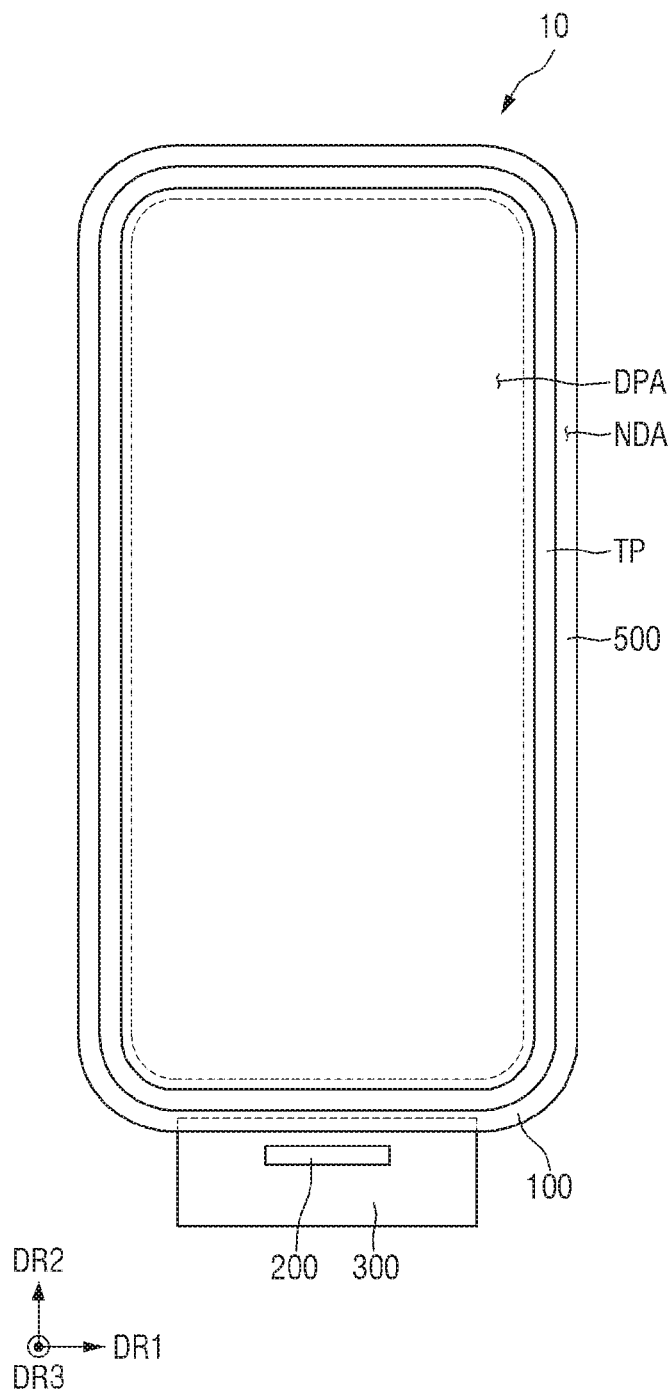
FIG. 11 is a plan view illustrating the trench formed in the display panel according to an embodiment.
Figure 12:
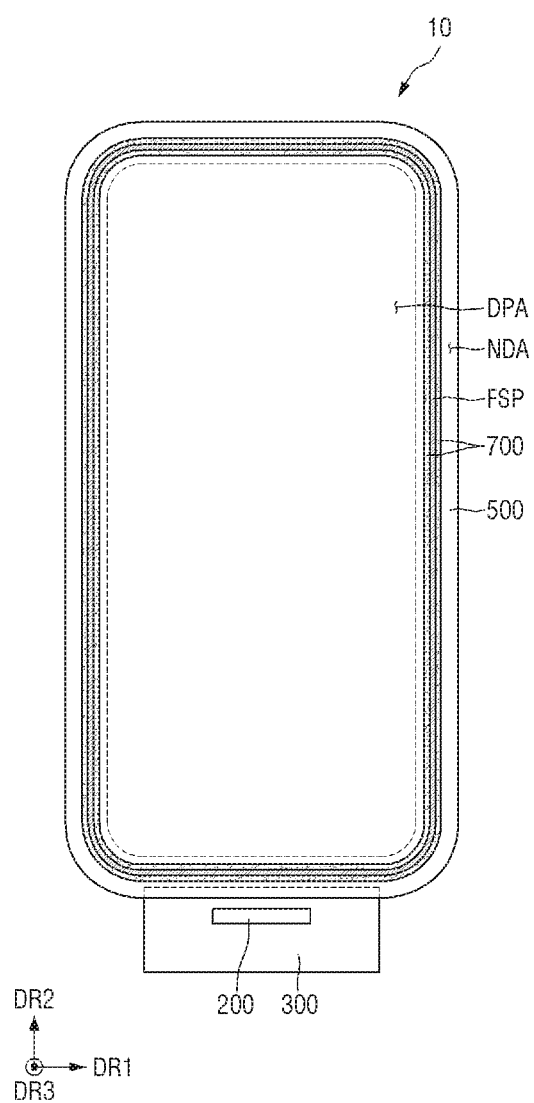
FIG. 12 is a plan view illustrating the sealing member and a fusion pattern disposed in the display device according to an embodiment.

FIG. 11 is a plan view illustrating the trench TP formed in the display panel 100 according to an embodiment. FIG. 12 is a plan view illustrating the sealing member 700 and the fusion pattern FSP disposed in the display device 10 according to an embodiment.

Referring to FIGS. 11 and 12, in an embodiment of the display device 10, the trench TP defined or formed in the display panel 100 may surround the display area DPA in a plan view. The trench TP may include a first extension portion extending in the first direction DR1 along the non-display area NDA, a second extension portion extending in the second direction DR2, and one or more curved corners where the first extension portion and the second extension portion are connected to each other. The trench TP may form a closed curve to surround the display area DPA and may include the first extension portion and the second extension portion corresponding to each short side of the display panel 100 extending in the first direction DR1 and each long side of the display panel 100 extending in the second direction DR2. In an embodiment, the trench TP may include a first curved corner where the first extension portion and the second extension portion meet. In an embodiment, as described above, since the metal wiring layer MTL disposed in the non-display area NDA surrounds the trench TP of the display panel 100 at a distance from the trench TP, the trench TP may be in the shape of a closed curve surrounding the display area DPA regardless of the position of the metal wiring layer MTL.

At least a portion of the sealing member 700 may be inserted into the trench TP and may be disposed in a same shape as the trench TP in a plan view. In one embodiment, for example, the sealing member 700 may include a first extension portion extending in the first direction DR1, a second extension portion extending in the second direction DR2, and one or more curved corners where the first extension portion and the second extension portion are connected. The sealing member 700 may form a closed curve to surround the display area DPA.

The width WF of the fusion pattern FSP may be smaller than the width WS of the sealing member 700 so that that the fusion pattern FSP is disposed inside the sealing member 700 along the sealing member 700 in a plan view. In an embodiment of the display device 10, since the fusion pattern FSP is disposed in a closed curve shape to overlap the sealing member 700 or the trench TP, the adhesion between the display panel 100 and the encapsulation substrate 500 may be improved. In an embodiment, as described above, since the metal wiring layer MTL of the display panel 100 is spaced apart from the trench TP, the fusion pattern FSP disposed across the trench TP of the display panel 100 may also be spaced apart from the metal wiring layer MTL. The fusion pattern FSP may be disposed in a closed curve shape along the sealing member 700 regardless of the position of the metal wiring layer MTL and may improve the adhesion between the display panel 100 and the encapsulation substrate 500.

However, the disclosure is not limited thereto, and alternatively, the fusion pattern FSP may also be disposed along the sealing member 700 but may be divided into a plurality of patterns spaced apart from each other. In an embodiment, the fusion pattern FSP may be formed at least along a first corner of the sealing member 700. Since the sealing member 700 that bonds the display panel 100 and the encapsulation substrate 500 together has the fusion pattern FSP formed at the first corner where the first extension portion and the second extension portion meet, durability may be further improved at the first corner with relatively weak adhesion. As will be described later, a process of the fusion pattern FSP may be achieved by a process of radiating a continuous laser, and the fusion pattern FSP having a linear or curved shape may be disposed in at least a portion of the non-display area NDA.

A method of fabricating the display device 10 according to an embodiment will now be described in detail.

Figure 13:
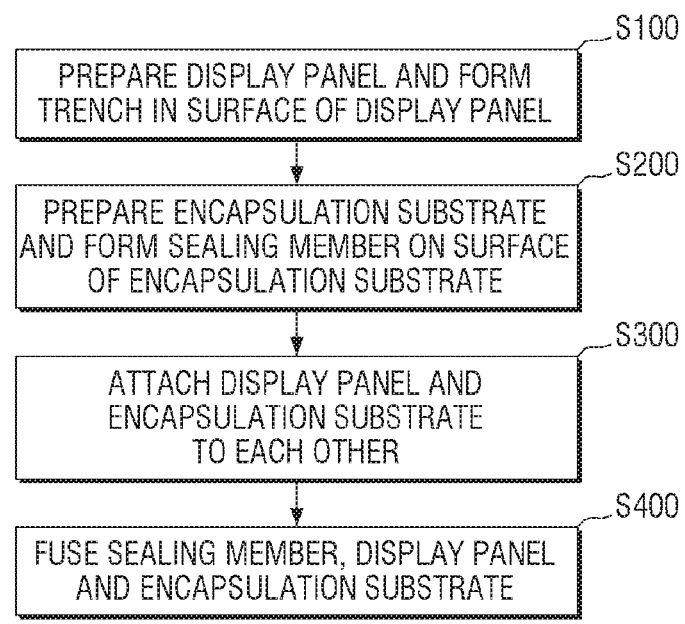
FIG. 13 is a flowchart illustrating a method of fabricating a display device according to an embodiment.

FIG. 13 is a flowchart illustrating a method of fabricating a display device according to an embodiment.

Referring to FIG. 13, an embodiment of the method of fabricating the display device 10 may include preparing a display panel 100 and forming a trench TP in a surface of the display panel 100 (S100), preparing an encapsulation substrate 500 and forming a sealing member 700 on a surface of the encapsulation substrate 500 (S200), attaching the display panel 100 and the encapsulation substrate 500 to each other (S300), and fusing the sealing member 700, the display panel 100 and the encapsulation substrate 500 (S400). In the display device 10, the sealing member 700 may be inserted into the trench TP formed in the display panel 100, and a fusion pattern FSP may be included to at least partially overlap the sealing member 700.

According to an embodiment, the method of fabricating the display device 10 may include radiating a first pulsed laser to form the trench TP in the display panel 100 and radiating a second pulsed laser to form the fusion pattern FSP after attaching the display panel 100 and the encapsulation substrate 500 to each other. Since the display device 10 has the sealing member 700 inserted into the trench TP and includes the fusion pattern FSP formed by the fusing of the display panel 100, the encapsulation substrate 500 and the sealing member 700, the adhesion between the display panel 100 and the encapsulation substrate 500 may be improved. An embodiment of the method of fabricating the display device 10 will hereinafter be described in greater detail with reference to FIGS. 14 through 18.

FIGS. 14 through 18 are cross-sectional views illustrating a process of fabricating a display device according to an embodiment.

First, referring to FIG. 14, a display panel 100 is prepared, and a first pulsed laser is radiated onto a surface of the display panel 100 to form a trench TP (S100). As described above, the display panel 100 includes a display area DPA in which light emitting elements EL are disposed and a non-display area NDA surrounding the display area DPA. The first pulsed laser may be radiated to the non-display area NDA of the display panel 100 to form the trench TP surrounding the display area DPA. In an embodiment, the first pulsed laser may be radiated at a frequency of 1 kilohertz (kHz) to 10 megahertz (MHz) for 10 femtoseconds to 50 picoseconds and may have an energy of about 0.1 microjoule (µJ) or more. The first pulsed laser may be directly radiated onto a base substrate 101 of the display panel 100, and a portion of an upper surface of the base substrate 101 may be removed to form the recessed trench TP. The features of the display panel 100 and the trench TP formed in the display panel 100 are the same as those described above.

Figure 15:
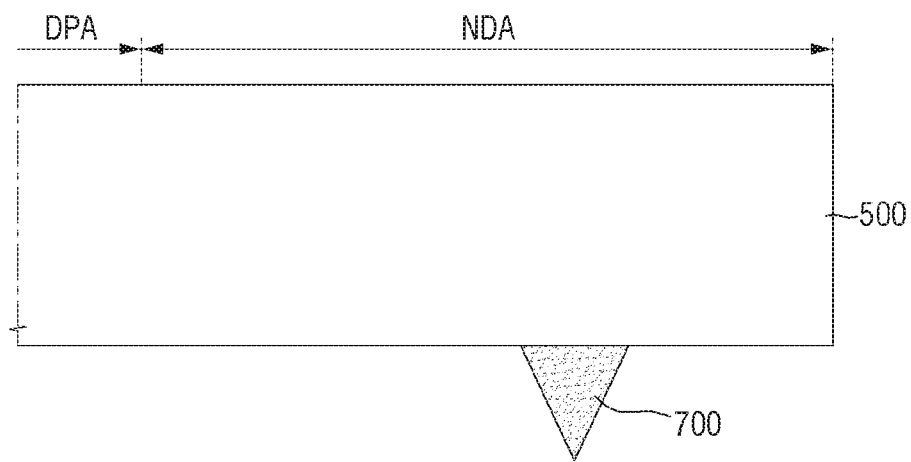

Next, referring to FIG. 15, an encapsulation substrate 500 is prepared, and a sealing member 700 is provided or formed on a surface of the encapsulation substrate 500 (S200). The sealing member 700 may include a frit as described above and may be formed by printing the frit on the encapsulation substrate 500 or the display panel 100 and then drying and baking the frit. In an embodiment, the sealing member 700 may be formed by preparing frit crystals on a surface of the display panel 100 or the encapsulation substrate 500 and then drying and baking the frit crystals. The frit crystals may be glass in powder form optionally added with an additive. As described above, the sealing member 700 may include a frit, and frit crystals may be melt-cured to form a structure having glass properties, thereby forming the sealing member 700. According to an embodiment, the sealing member 700 may have inclined side surfaces and have a shape corresponding to the shape of the trench TP of the display panel 100, as described above.

Figure 16:
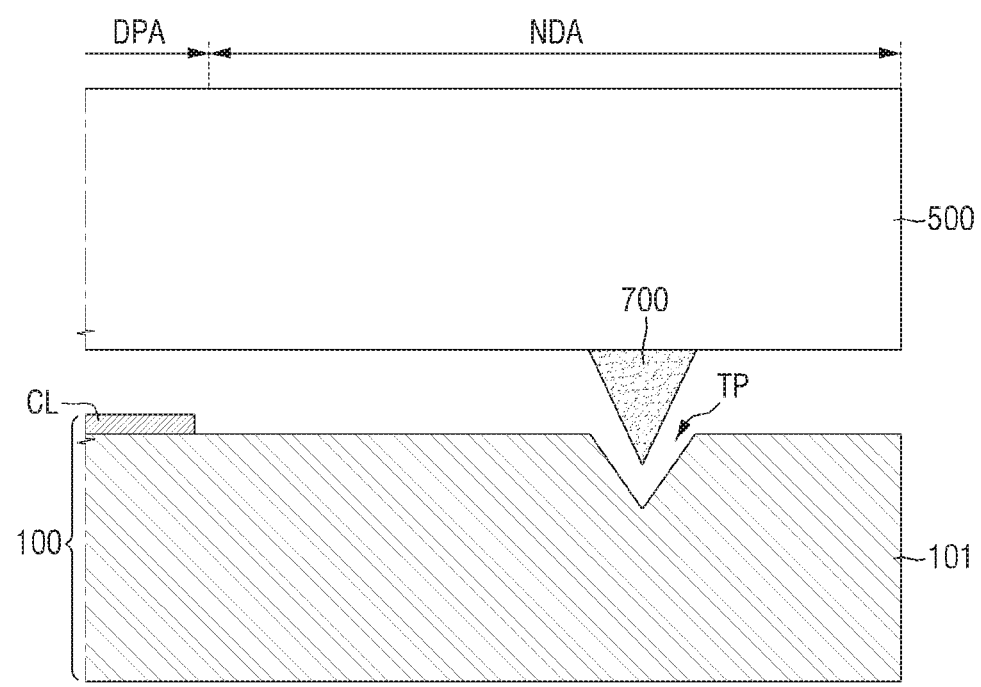
Figure 17:
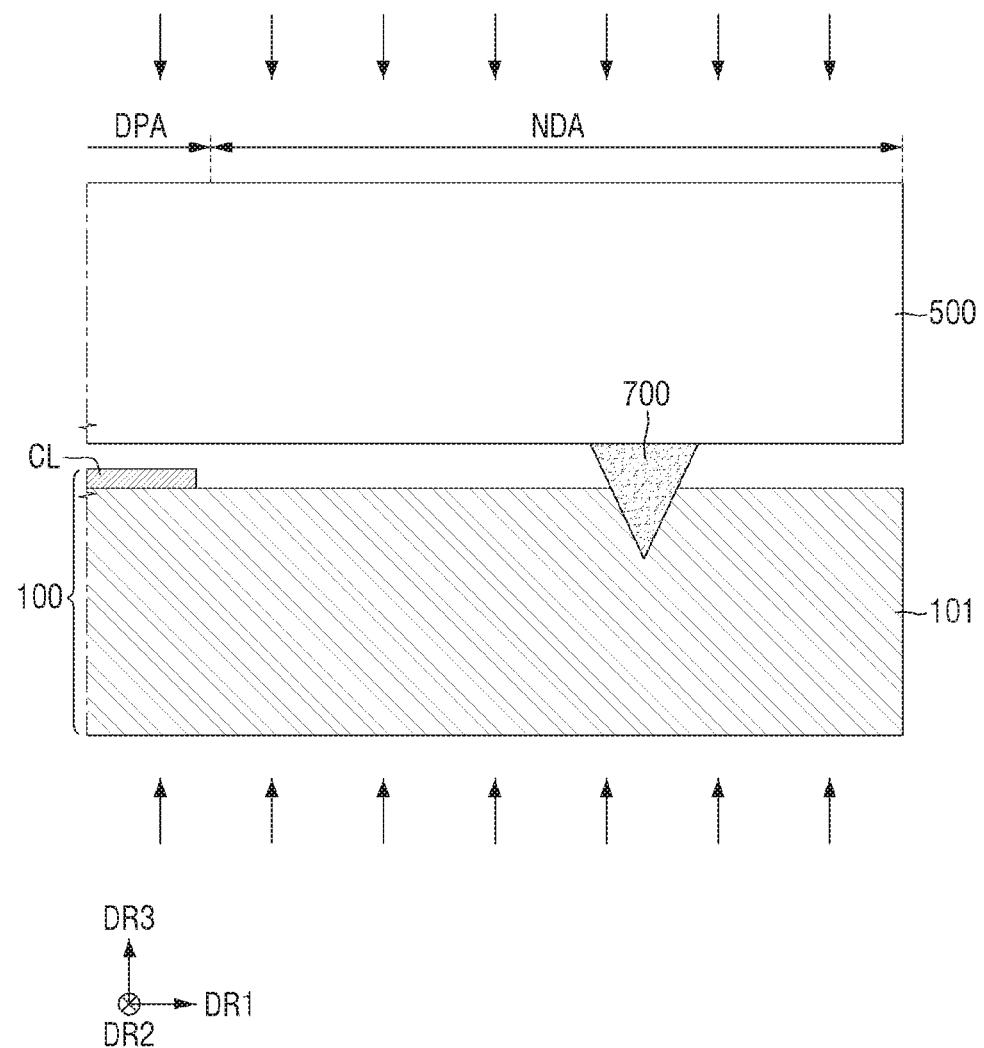

Next, referring to FIGS. 16 and 17, the display panel 100 and the encapsulation substrate 500 are aligned to allow the sealing member 700 to be inserted into the trench TP and then are attached to each other (S300). Although only a portion of the non-display area NDA is illustrated in FIGS. 16 and 17 for convenience of illustration, the sealing member 700 may be placed between the display panel 100 and the encapsulation substrate 500 to surround the display area DPA. In the attaching of the display panel 100 and the encapsulation substrate 500 to each other, the trench TP of the display panel 100 and the sealing member 700 disposed on the surface of the encapsulation substrate 500 may be aligned to overlap each other in the thickness direction. In a state where the sealing member 700 overlaps the trench TP, the display panel 100 and the encapsulation substrate 500 may be aligned or disposed to be spaced apart from each other by a gap within a preset range. Then, moisture or air existing between the display panel 100 and the encapsulation substrate 500 may be removed, and the sealing member 700 may be inserted into the trench TP of the display panel 100 through the attaching process. The sealing member 700 may seal the light emitting elements EL disposed in the display area DPA together with the encapsulation substrate 500.

However, in the operation of FIG. 17, the sealing member 700 is placed to contact an upper surface of the display panel 100 and a lower surface of the encapsulation substrate 500 but may not be bonded to or fused with the display panel 100 and the encapsulation substrate 500 together. That is, the sealing member 700 may form a physical boundary with each of the display panel 100 and the encapsulation substrate 500 and may be attached to the display panel 100 and the encapsulation substrate 500. The method of fabricating the display device 10 may include an operation of fusing the display panel 100, the sealing member 700 and the encapsulation substrate 500 by radiating a pulsed laser to at least the sealing member 700.

Figure 18:
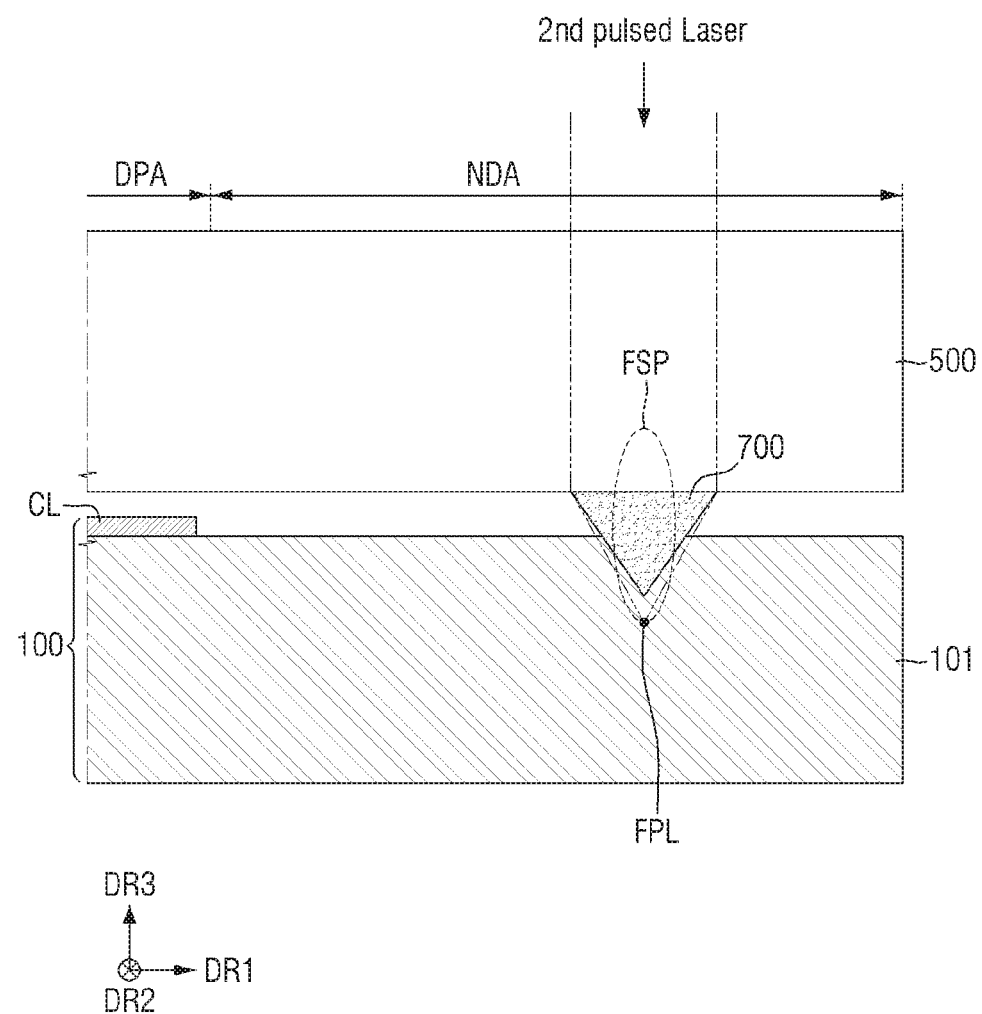

Referring to FIG. 18, a fusion pattern FSP is formed by radiating a second pulsed laser to the sealing member 700, and the display panel 100, the sealing member 700 and the encapsulation substrate 500 are partially fused (S400). The second pulsed laser may be radiated to at least the sealing member 700 to form the fusion pattern FSP disposed across the sealing member 700 between the display panel 100 and the encapsulation substrate 500. In one embodiment, for example, the second pulsed laser may be radiated to the base substrate 101 of the display panel 100, the sealing member 700, and the encapsulation substrate 500.

According to an embodiment, the sealing member 700 may include or be made of a transparent frit. The sealing member 700 may include a light transmitting material so that the second pulsed laser may be radiated across the encapsulation substrate 500 and the display panel 100. The second pulsed laser may be radiated from an upper surface of the encapsulation substrate 500 or a lower surface of the display panel 100 to reach the encapsulation substrate 500 or the display panel 100 after transmitting through the sealing member 700 and may cause the sealing member 700 to be fused with the display panel 100 and the encapsulation substrate 500.

According to an embodiment, the second pulsed laser may be radiated from the upper surface of the encapsulation substrate 500 and may be set in a way such that a laser focus FPL is located inside the display panel 100. In one embodiment, for example, the second pulsed laser may be set in a way such that the laser focus FPL is located inside the display panel 100 at a predetermined distance from the trench TP of the display panel 100, and the distance between the trench TP and the laser focus FPL of the second pulsed laser may be in a range of about 0.1 μm to about 200 μm. Accordingly, the fusion pattern FSP may include a fusion area FA which becomes wider as the distance from the laser focus FPL increases, but the disclosure is not limited thereto.

In an embodiment, the second pulsed laser may have substantially a same intensity as the first pulsed laser. The second pulsed laser may partially fuse materials of the encapsulation substrate 500, the sealing member 700 and the display panel 100. The second pulsed laser may be radiated from the upper surface of the encapsulation substrate 500 along the sealing member 700. In an embodiment, the second pulsed laser may be continuously radiated along the non-display area NDA in which the sealing member 700 is disposed.

Although not illustrated in the drawing, the second pulsed laser may be radiated from the upper surface of the encapsulation substrate 500 along the sealing member 700, and a metal wiring layer MTL disposed in the non-display area NDA may be placed in the base substrate 101 at a distance from the trench TP. Therefore, the metal wiring layer MTL of the display panel 100 may be effectively prevented from being damaged by the second pulsed laser. In such an embodiment, the display device 10 includes the sealing member 700 disposed between the display panel 100 and the encapsulation substrate 500, and the fusion pattern FSP disposed to overlap the display panel 100 and the encapsulation substrate 500, such that the adhesion between the display panel 100 and the encapsulation substrate 500 may be improved, and the durability of the display device 10 against external impact may be enhanced.

Alternative embodiments of the display device 10 will now be described with reference to FIGS. 19 through 21.

Figure 19:
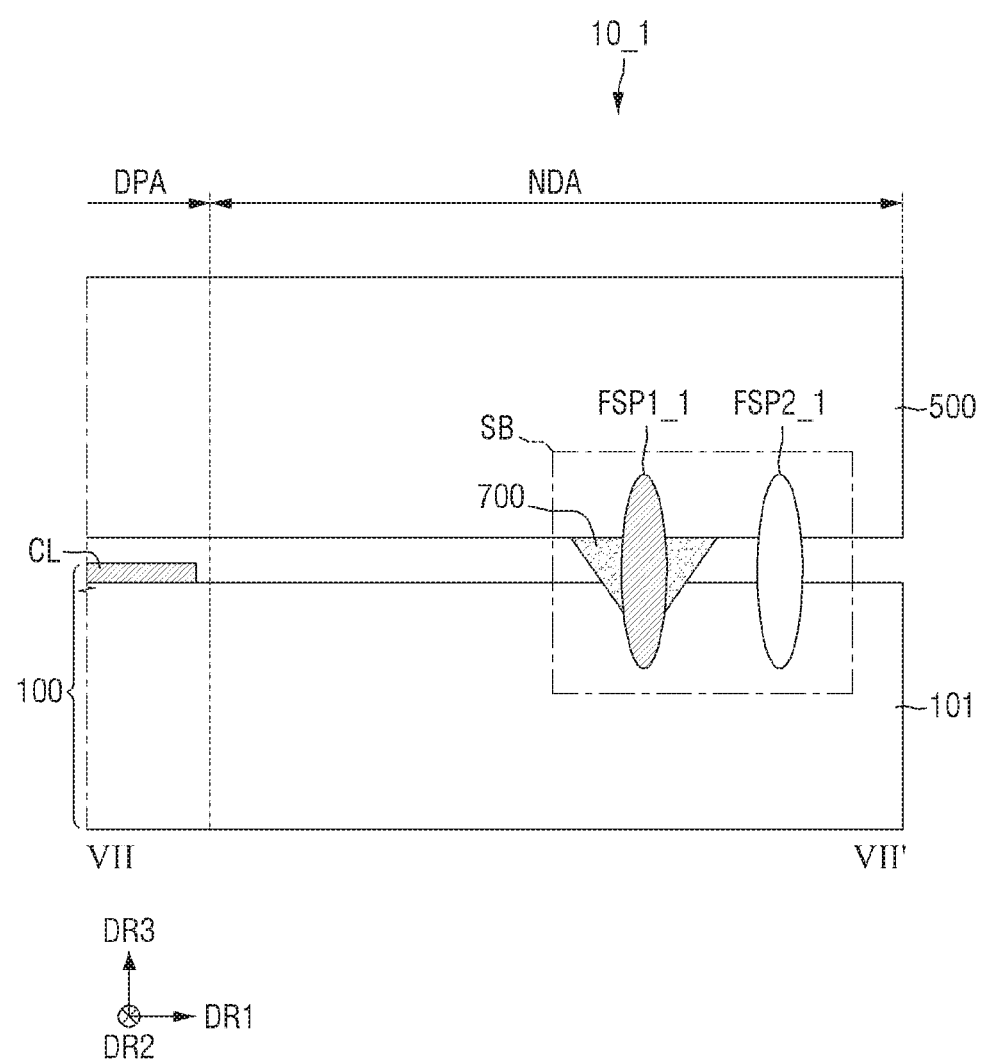
FIG. 19 is a cross-sectional view of a portion of a display device according to an alternative embodiment.

FIG. 19 is a cross-sectional view of a portion of a display device 10_1 according to an alternative embodiment. FIG. 20 is an enlarged view of portion SB of FIG. 19. FIG. 21 is a plan view illustrating a first fusion pattern FSP1_1 and a second fusion pattern FSP2_1 in the display device 10_1 according to an embodiment.

Figure 20:
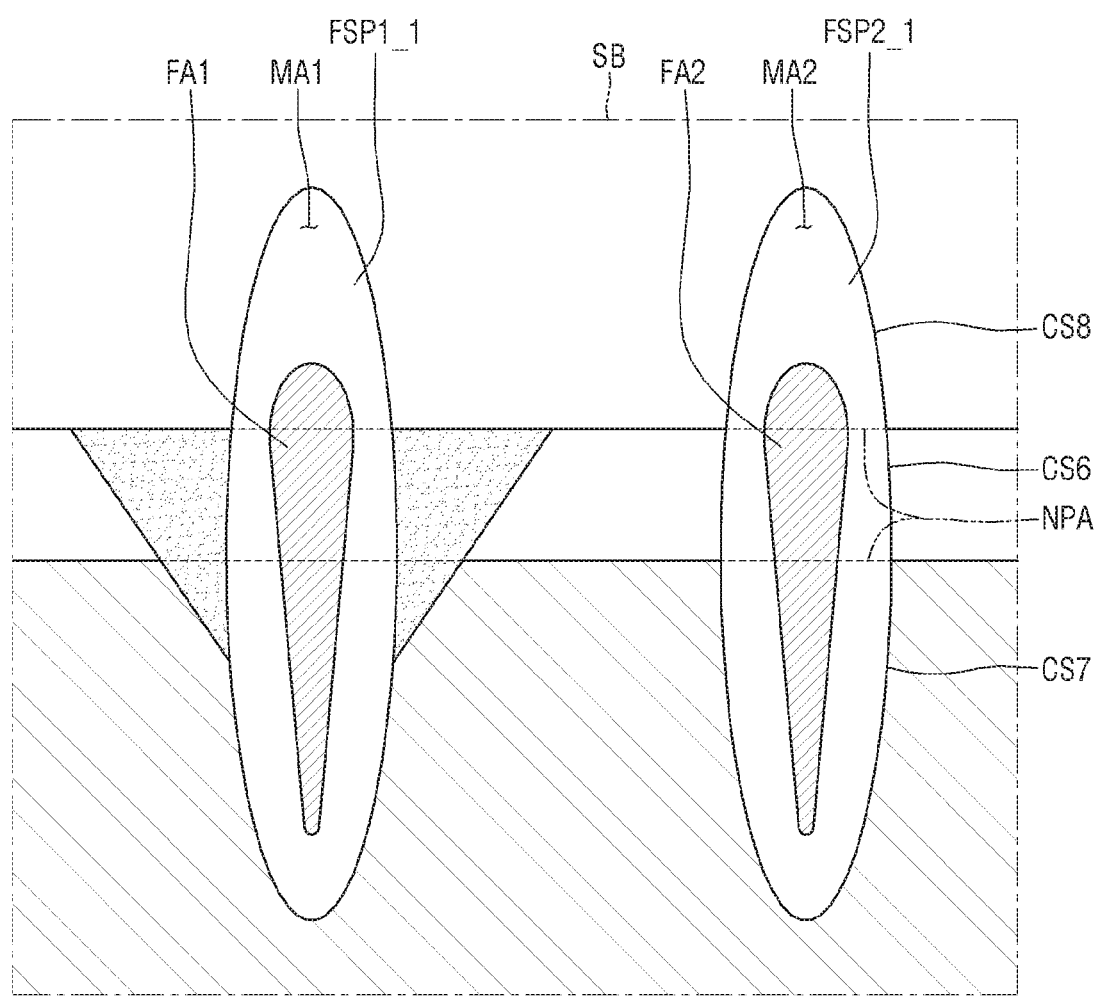
FIG. 20 is an enlarged view of portion SB of FIG. 19.
Figure 21:
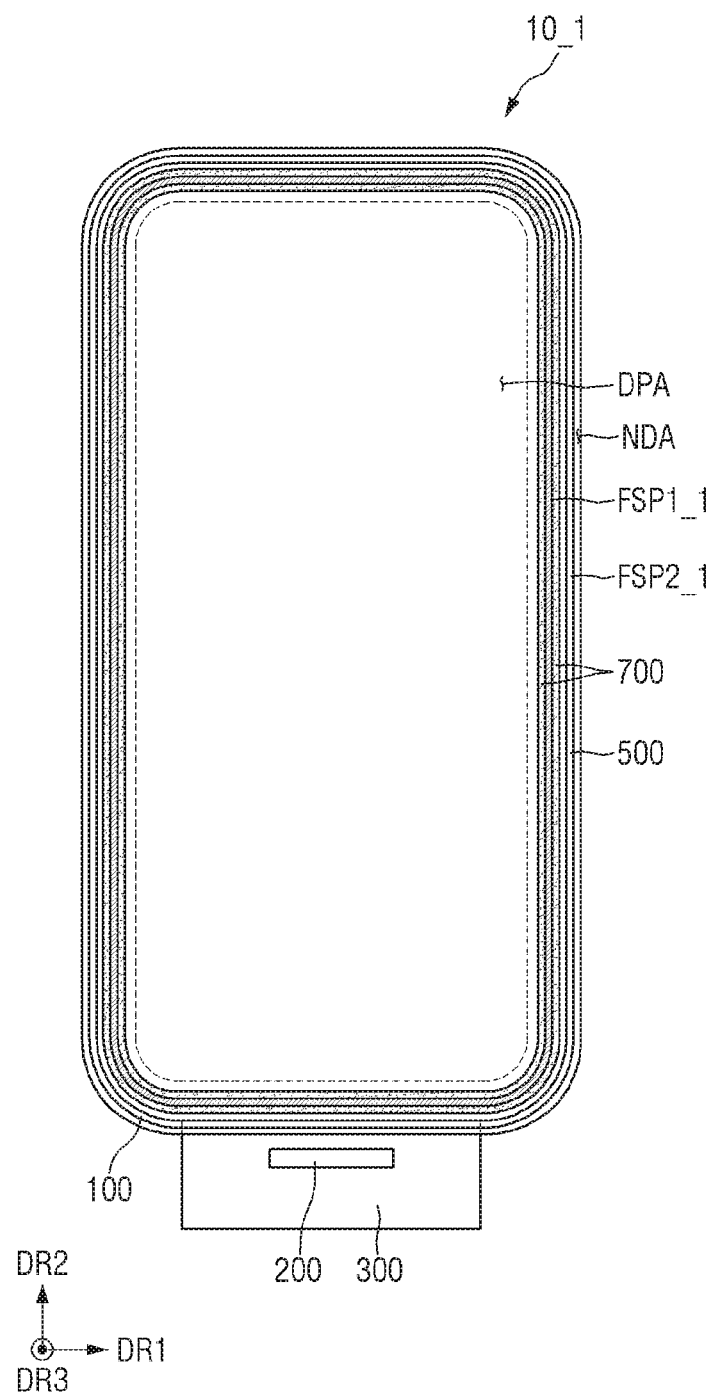
FIG. 21 is a plan view illustrating a first fusion pattern and a second fusion pattern in the display device of FIG. 19.

Referring to FIGS. 19 through 21, an embodiment of the display device 101 may include the first fusion pattern FSP1_1 which has at least a portion overlapping a sealing member 700 and is disposed over a display panel 100 and an encapsulation substrate 500, and a second fusion pattern FSP2_1 which does not overlap the sealing member 700 and is disposed over the display panel 100 and the encapsulation substrate 500. The display device 101 may further include the second fusion pattern FSP2_1 formed by direct fusion of the encapsulation substrate 500 and the display panel 100 in addition to the first fusion pattern FSP1_1 and may further improve the adhesion between the display panel 100 and the encapsulation substrate 500. The embodiment of FIGS. 19 and 20 is substantially the same as the embodiment of FIG. 7 except for the second fusion pattern FSP2_1.

In an embodiment, the display device 101 may include a plurality of fusion patterns FSP_1. In one embodiment, for example, the fusion patterns FSP_1 may include the first fusion pattern FSP1_1 which is disposed over the display panel 100 and the encapsulation substrate 500 to overlap the sealing member 700 and formed by fusion of these elements and the second fusion pattern FSP2_1 which does not overlap the sealing member 700 and is formed by direct fusion of the display panel 100 and the encapsulation substrate 500. In such an embodiment, the first fusion pattern FSP1_1 may include a fusion area FA1 in which the material of the sealing member 700 and the material of the encapsulation substrate 500 are fused and a molten area MA1 which surrounds the fusion area FA and in which the materials of the sealing member 700, the display panel 100 and the encapsulation substrate 500 are melted and mixed with each other. Since the first fusion pattern FSP1_1 is the same as the fusion pattern FSP described above with reference to FIG. 7, a repetitive detailed description of the same or like elements will be omitted, and the second fusion pattern FSP2_1 will hereinafter be mainly described in detail.

The second fusion pattern FSP2_1 may be spaced apart from the sealing member 700 and the first fusion pattern FSP1_1. According to an embodiment, the second fusion pattern FSP2_1 may be disposed outside the sealing member 700 based on a display area DPA of the display device 10_1. Like the first fusion pattern FSP1_1, the second fusion pattern FSP2_1 may be disposed in the shape of a closed curve to surround at least the display area DPA and may surround the sealing member 700 from outside the sealing member 700. Since the second fusion pattern FSP2_1 is spaced apart from the sealing member 700, the second fusion pattern FSP2_1 may not overlap the sealing member 700 in the thickness direction. In an embodiment, the second fusion pattern FSP2_1 may be spaced apart from a trench TP of the display panel 100 and disposed along the outside of the trench TP.

According to an embodiment, the second fusion pattern FSP2_1 may be formed by a process of radiating a pulsed laser whose focus is set inside the display panel 100 or a base substrate 101. After a process of forming the first fusion pattern FSP1_1, a third pulsed laser (not illustrated) may be radiated along the outside of the sealing member 700, and the display panel 100 or the base substrate 101 and the encapsulation substrate 500 may be fused by the third pulsed laser to form the second fusion pattern FSP2_1.

The second fusion pattern FSP2_1 may have substantially the same shape as the first fusion pattern FSP1_1. In one embodiment, for example, the second fusion pattern FSP2_1 may include a fusion area FA2 which becomes wider from the display panel 100 toward the encapsulation substrate 500 and a molten area MA2 which surrounds the fusion area FA2. The second fusion pattern FSP2_1 may include a boundary surface CS8 formed in a portion overlapping the encapsulation substrate 500, a boundary surface CS7 formed in a portion overlapping the display panel 100, and a boundary surface CS6 formed in a portion overlapping the space between the encapsulation substrate 500 and the display panel 100. No physical boundary may exist in a portion of an extension line of each of a lower surface of the encapsulation substrate 500 and an upper surface of the display panel 100 where the second fusion pattern FSP2_1 is located. At the boundary surface CS7 or CS8 formed by the second fusion pattern FSP2_1 and the encapsulation substrate 500 or the display panel 100, not a physical boundary but a boundary due to a difference in component content may be defined or formed. The radiation of the third pulsed laser may cause materials that form the encapsulation substrate 500 and the base substrate 101 of the display panel 100 to be mixed and fused, thereby forming the second fusion pattern FSP2_1.

However, the third pulsed laser may be radiated to an area not overlapping the sealing member 700 so that the second fusion pattern FSP2_1 is formed in a position not to overlap the sealing member 700. According to an embodiment, the second fusion pattern FSP2_1 may be formed by mixing and fusing of the materials of the encapsulation substrate 500 and the base substrate 101 and may not include the material of the sealing member 700. While at least a portion of the first fusion pattern FSP1_1 overlaps the sealing member 700, the second fusion pattern FSP2_1 may not overlap the sealing member 700 and may not include the material of the sealing member 700. The first fusion pattern FSP1_1 and the second fusion pattern FSP2_1 may have similar shapes as each other but may have different component contents from each other. Other features of the second fusion pattern FSP2_1 are substantially the same as those of the first fusion pattern FSP1_1 described above, and thus any repetitive detailed description thereof will be omitted.

Figure 22:
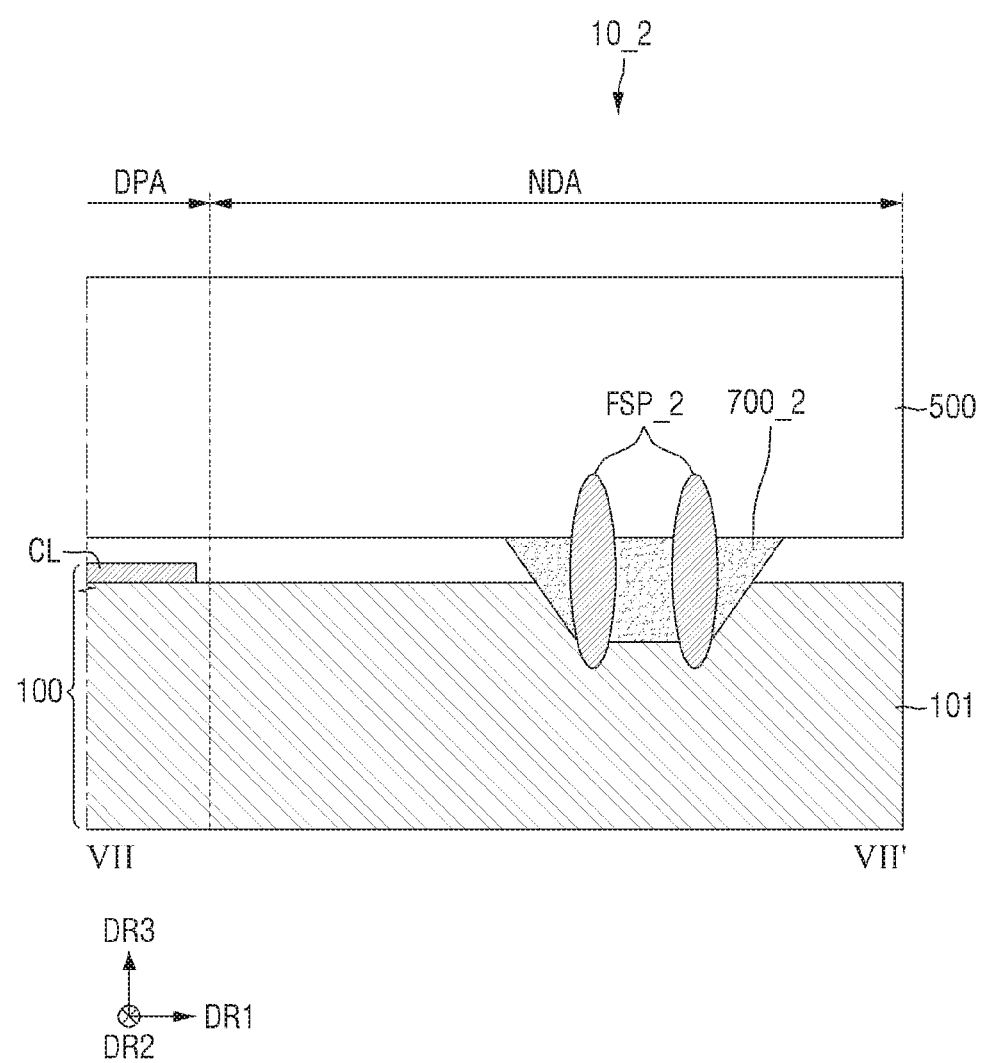
FIG. 22 is a cross-sectional view of a portion of a display device according to another alternative embodiment.

FIG. 22 is a cross-sectional view of a portion of a display device 10_2 according to another alternative embodiment.

Referring to FIG. 22, in an embodiment of the display device 10_2, a sealing member 700_2 may include inclined side surfaces and one flat surface connecting the side surfaces. In addition, a trench TP formed in a display panel 100 may include inclined side surfaces and a flat lower surface to correspond to the shape of the sealing member 700_2. In such an embodiment of the display device 102, the sealing member 700_2 and the trench TP of the display panel 100 may contact each other over a wide area, and adhesion therebetween may be improved. In such an embodiment, since the sealing member 700_2 has a relatively wide width, the display device 10_2 may include a greater number of fusion patterns FSP_2 to further improve the adhesion between the display panel 100 and an encapsulation substrate 500. The embodiment of FIG. 22 is substantially the same as the embodiment of FIG. 7 except for shapes of the sealing member 700_2 and the trench TP and the number of the fusion patterns FSP_2 disposed to overlap the sealing member 700_2. Accordingly, any repetitive detailed description of the same or like elements as those described above will hereinafter be omitted.

The sealing member 700_2 of the display device 102 may include not only the inclined surfaces but also the flat surface connecting the side surfaces. The trench TP of the display panel 100 may include inclined inner walls and a flat surface to correspond to the shape of the sealing member 700_2. The sealing member 700_2 and the trench TP may be wider than those of the embodiment of FIG. 7 and may contact each other over a wider area.

In such an embodiment, since the sealing member 700_2 has a larger width, a greater number of fusion patterns FSP_2 may be disposed along the widthwise direction of the sealing member 700_2. The fusion patterns FSP_1 may include a first pattern disposed adjacent to a display area DPA and a second pattern disposed outside the first pattern at a distance from the first pattern to surround the display area DPA. In such an embodiment of the display device 10_2 the trench TP and the sealing member 700_2 may have a wider width, and a greater number of fusion patterns FSP_2 may be disposed or formed in the trench TP and the sealing member 700_2. The embodiment of FIG. 22 including a greater number of fusion patterns FSP_2 may further improve the adhesion between the display panel 100 and the encapsulation substrate 500.

Embodiments of a display device according to the invention may include a display panel which includes a trench recessed into a portion of an upper surface, an encapsulation substrate which is spaced apart from the display panel to face the display panel, and a sealing member which is inserted into the trench. In such embodiments, the display device may include a fusion pattern formed by fusion of the sealing member, the encapsulation substrate and the display panel, and the fusion pattern may be formed in the shape of a closed curve along the sealing member. Since the fusion pattern is formed by mixing of materials of the sealing member, the encapsulation substrate and the display panel, the adhesion between the display panel and the encapsulation substrate may be improved such that the display device may have improved durability against external impact by including a fusion pattern.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
 a display panel comprising a display area and a non-display area surrounding the display area, the display panel further comprising a base substrate and a metal wiring layer disposed on at least a portion of the base substrate;
 an encapsulation substrate disposed on the display panel;
 a sealing member disposed between the display panel and the encapsulation substrate to bond the display panel and the encapsulation substrate together; and
 a first fusion pattern disposed inside the display panel, the sealing member and the encapsulation substrate,
 wherein a trench is defined in the non-display area of the display panel and recessed from an upper surface of the display panel,
 the metal wiring layer comprises a portion disposed on an upper surface of the base substrate and a bridge portion spaced apart from the trench and disposed inside the base substrate,
 the sealing member is inserted into the trench,
 a width of the sealing member disposed between the encapsulation substrate and the display panel is greater than a width of the trench, and
 the first fusion pattern is disposed to overlap the trench.

2. The display device of claim 1, wherein the first fusion pattern includes a material of the sealing member, a material of the display panel and a material of the encapsulation substrate, which are mixed with each other.

3. The display device of claim 2, wherein
the sealing member includes at least a portion directly contacting the trench and the encapsulation substrate such that a first boundary surface contacting the trench and a second boundary surface contacting the encapsulation substrate are defined, and
no physical boundary exists in a portion of the first fusion pattern corresponding to an extension line of each of the first boundary surface and the second boundary surface.

4. The display device of claim 3, wherein
the first fusion pattern comprises a first portion overlapping the display panel, a second portion contacting the sealing member and a third portion overlapping the encapsulation substrate, and
the first fusion pattern includes a third boundary surface between the second portion and the sealing member, a fourth boundary surface between the first portion and the display panel and a fifth boundary surface between the third portion and the encapsulation substrate.

5. The display device of claim 4, wherein
the third portion of the first fusion pattern comprises the material of the sealing member, and
the second portion comprises the material of the encapsulation substrate.

6. The display device of claim 2, wherein
the first fusion pattern comprises a fusion area, in which the sealing member, the display panel and the encapsulation substrate are partially fused, and a molten area which surrounds the fusion area.

7. The display device of claim 6, wherein the fusion area comprises a portion which becomes wider as being away farther from the display panel toward the encapsulation substrate.

8. The display device of claim 2, wherein the sealing member comprises a frit through which light is transmitted.

9. The display device of claim 8, wherein
a side surface of the sealing member are inclined, and
an inner wall of the trench is inclined to correspond to the side surface of the sealing member.

10. The display device of claim 8, wherein
a maximum width of the sealing member is in a range of 10 µm to 100 µm, and
a maximum width of the first fusion pattern is in a range of 8 µm to 12 µm.

11. The display device of claim 2, further comprising:
a second fusion pattern disposed in a periphery of the non-display area between the display panel and the encapsulation substrate,
wherein the second fusion pattern includes the material of the display panel and the material of the encapsulation substrate.

12. The display device of claim 11, wherein the second fusion pattern does not overlap the sealing member and the trench in a thickness direction.

13. The display device of claim 11, wherein
the first fusion pattern comprises the material of the sealing member, and
the second fusion pattern does not comprise the material of the sealing member.

14. A display device comprising:
a first substrate comprising a display area in which a plurality of light emitting elements are disposed and a non-display area surrounding the display area;
a second substrate disposed on the first substrate;
a sealing member disposed between the first substrate and the second substrate and disposed in the non-display area to surround the display area; and
a first fusion pattern disposed between the first substrate and the second substrate to overlap the sealing member; and
a second fusion pattern disposed in a periphery of the non-display area between the first substrate and the second substrate, the second fusion pattern surrounding the sealing member;
wherein a trench is defined in the non-display area of the first substrate to surround the display area,
a width of the sealing member disposed between the second substrate and the first substrate is greater than a width of the trench, and
the first fusion pattern overlaps the trench to have a closed curve shape surrounding the display area.

15. The display device of claim 14, wherein
a maximum width of the trench is smaller than a maximum width of the sealing member, and
at least a portion of the sealing member is inserted into the trench.

16. The display device of claim 15, wherein
the maximum width of the sealing member is in a range of 10 µm to 100 µm, and
a maximum width of the first fusion pattern is in a range of 8 µm to 12 µm.

17. The display device of claim 14, wherein the first fusion pattern comprises a material of the sealing member, a material of the first substrate and a material of the second substrate, which are mixed with each other.

18. A display device comprising:
a display panel comprising a display area and a non-display area surrounding the display area;
an encapsulation substrate disposed directly on the display panel;
a sealing member disposed between the display panel and the encapsulation substrate to bond the display panel and the encapsulation substrate together;
a first fusion pattern disposed inside the display panel, the sealing member and the encapsulation substrate, the first fusion pattern comprising a material of the sealing member, a material of the display panel, and a material of the encapsulation substrate, which are mixed with each other; and
a second fusion pattern disposed in a periphery of the non-display area between the display panel and the encapsulation substrate, the second fusion pattern comprising the material of the display panel and the material of the encapsulation substrate;
wherein a trench is defined in the non-display area of the display panel and recessed from an upper surface of the display panel;
wherein the sealing member is inserted into the trench;
wherein a width of the sealing member disposed between the encapsulation substrate and the display panel is greater than a width of the trench; and
wherein the first fusion pattern is disposed to overlap the trench.

19. The display device of claim 18, wherein the second fusion pattern does not overlap the sealing member and the trench in a thickness direction.

20. The display device of claim 18, wherein the second fusion pattern does not comprise the material of the sealing member.

* * * * *